United States Patent
Katayama

(10) Patent No.: US 7,697,656 B2
(45) Date of Patent: Apr. 13, 2010

(54) SHIFT REGISTER, METHOD OF CONTROLLING THE SAME, ELECTRO-OPTICAL DEVICE, AND ELECTRONIC APPARATUS

(75) Inventor: Shigenori Katayama, Azumino (JP)

(73) Assignee: Seiko Epson Corporation (JP)

( * ) Notice: Subject to any disclaimer, the term of this patent is extended or adjusted under 35 U.S.C. 154(b) by 1137 days.

(21) Appl. No.: 11/324,371

(22) Filed: Jan. 3, 2006

(65) Prior Publication Data

US 2006/0187718 A1 Aug. 24, 2006

(30) Foreign Application Priority Data

Feb. 1, 2005 (JP) ............................. 2005-024968

(51) Int. Cl.
*G11C 19/00* (2006.01)

(52) U.S. Cl. .......................... 377/70; 377/64; 377/72; 377/73; 377/74; 345/100; 345/204

(58) Field of Classification Search ................. 345/100, 345/204; 377/64–81
See application file for complete search history.

(56) References Cited

U.S. PATENT DOCUMENTS

| | | | | |
|---|---|---|---|---|
| 5,859,630 A | * | 1/1999 | Huq | 345/100 |
| 6,876,352 B1 | * | 4/2005 | Sato et al. | 345/100 |
| 7,151,523 B2 | * | 12/2006 | Ohkawa et al. | 345/100 |
| 7,515,134 B2 | * | 4/2009 | Katayama | 345/100 |
| 2004/0150610 A1 | * | 8/2004 | Zebedee et al. | 345/100 |

FOREIGN PATENT DOCUMENTS

| | | |
|---|---|---|
| JP | 61-175999 | 8/1986 |
| JP | 11-176186 | 7/1999 |
| JP | 2003-228315 | 8/2003 |

* cited by examiner

*Primary Examiner*—Richard Hjerpe
*Assistant Examiner*—Gregory J Tryder
(74) *Attorney, Agent, or Firm*—Harness, Dickey & Pierce, P.L.C.

(57) ABSTRACT

It is provided a method of controlling a shift register in which a plurality of transfer unit circuits, each having a storage unit and a writing unit, are connected in series. The storage unit has a hold gate and stores a logical level of a pulse when the hold gate is in an active state, and the writing unit has a writing gate and stores a pulse in the storage unit when the writing gate is in an active state. The method includes: performing control such that the writing gate is shifted from the active state to the non-active state and then the hold gate is shifted from the non-active state to the active state, when the writing gate is shifted from an active state to a non-active state and the hold gate is shifted from a non-active state to an active state; and performing control such that the hold gate is shifted from the active state to the non-active state and then the writing gate is shifted from the non-active state to the active state, when the writing gate is shifted from the non-active state to the active state and the hold gate is shifted from the active state to the non-active state.

9 Claims, 21 Drawing Sheets

SHIFT REGISTER, METHOD OF CONTROLLING THE SAME, ELECTRO-OPTICAL DEVICE, AND ELECTRONIC APPARATUS

The entire disclosure of Japanese Application No. 2005-024968, filed Feb. 1, 2005 is expressly incorporated by reference herein.

BACKGROUND

1. Technical Field

The present invention relates to a shift register that can transfer a pulse, to a method of controlling the same, to an electro-optical device, and to an electronic apparatus.

2. Related Art

Electro-optical devices, which perform display through an electro-optical change of an electro-optical material, such as liquid crystal, or organic electroluminescence (EL), have been widely used as display devices such as an information processing apparatus, a television, or the like. Among the electro-optical devices, there is an active-matrix-type device which drives a pixel through a pixel switch. That is, in the active-matrix-type electro-optical device, pixel electrodes are formed so as to correspond to intersections of scanning lines extending in a row direction and data lines extending in a column direction. In addition, a pixel switch, such as a thin film transistor or the like, which is turned on or off according to a scanning signal supplied to the scanning line, is inserted between each pixel electrode and each data line at the intersection. In addition, a counter electrode is provided so as to face the pixel electrode with the electro-optical material therebetween.

In this configuration, if a scanning signal of an ON voltage is applied to the scanning line, a pixel switch connected to the corresponding scanning line is turned on. At the time when the pixel switch is turned on, if a data signal according to a gray-scale level (concentration) is supplied to the data line, since the corresponding data signal is applied to the pixel electrode through the pixel switch, a voltage according to the data signal is applied to the electro-optical material interposed between the corresponding pixel electrode and the counter electrode. Thereby, the electro-optical material is subjected to an electro-optical change. As a result, in each pixel, an amount of transmitted light, an amount of reflected light, or an amount of emitted light (at least, an amount of light which an observer can recognize) depends on the voltage of the data signal applied to the pixel electrode. Therefore, this control is performed for every pixel, which results in predetermined display.

Here, the scanning signal is output from a scanning line driving circuit. The scanning line driving circuit has a Y shift register in which a plurality of stages of circuit blocks are connected with multiple stages in a Y direction. The Y shift register shifts a start pulse supplied at the beginning of a vertical scanning period using a Y clock signal that becomes a reference of the horizontal scanning. In addition, the data signal is output from the data line driving circuit. The data line driving circuit supplies the sampling signal to a sampling switch sampling the image signal supplied in synchronization with the vertical scanning and the horizontal scanning for every data line for a horizontal effective scanning period. In more detail, the data line driving circuit has an X shift register in which a plurality of stages of circuit blocks are connected with multiple stages in an X direction. The X shift register shifts a start pulse supplied at the beginning of a first horizontal scanning period using an X clock signal in synchronization with a period for which the image signal is supplied.

In JP-A-2003-228315, as the shift register used in the above-mentioned driving circuits, a shift register is disclosed in which a plurality of circuit blocks are cascade-connected and each of the circuit blocks has a transfer circuit and a clock control circuit. Here, the transfer circuit is supplied with first and second clock signals, but if periods for which these signals become effective overlap, there is a possibility that erroneous operation occurs. Accordingly, a structure using a waveform shaping circuit shown in FIG. 27 is disclosed in JP-A-2003-228315. This waveform shaping circuit is composed of five inverters 711 to 715. The inverters 714 and 715 constitute a latch circuit. Thereby, the overlapping period can be decreased.

However, in the waveform shaping circuit disclosed in JP-A-2003-228315, in order to arrange phases of a non-inverted clock signal CL and an inverted clock signal CL*, it is required to use the inverters 712 to 715 each having a high driving capability. For this reason, there is a problem in that power consumption and noise increase. In addition, if the inverters 712 and 715 each having a low driving capability are used, waveforms of the non-inverted clock signal CL and the inverted clock signal CL* overlap, which results in erroneous operation in the transfer unit circuit. In particular, when the pulse is transferred from any transfer unit circuit to the next transfer unit circuit, a problem occurs in that the pulse is transferred from the next transfer unit circuit to a transfer unit circuit subsequent to the next transfer unit circuit.

SUMMARY

An advantage of some aspects of the invention is that it provides a shift register capable of being operated with low power consumption, a method of controlling the same, an electro-optical device using the same, and an electronic apparatus.

According to a first aspect of the invention, it is provided a method of controlling a shift register in which a plurality of transfer unit circuits, each having a storage unit and a writing unit, are connected in series. The storage unit has a hold gate and stores a logical level of a pulse when the hold gate is in an active state, and the writing unit has a writing gate and stores a pulse in the storage unit when the writing gate is in an active state. The method includes: performing control such that the writing gate is shifted from the active state to the non-active state and then the hold gate is shifted from the non-active state to the active state, when the writing gate is shifted from an active state to a non-active state and the hold gate is shifted from a non-active state to an active state; and performing control such that the hold gate is shifted from the active state to the non-active state and then the writing gate is shifted from the non-active state to the active state, when the writing gate is shifted from the non-active state to the active state and the hold gate is shifted from the active state to the non-active state.

According to this aspect, it is normal that for states of the writing gate and the hold gate, one of the writing gate and the hold gate is in an active state and the other is in a non-active state, and at the time of transferring a pulse, the other is in an active state and the one is in a non-active state. In addition, when the states are shifted, the writing gate and the hold gate simultaneously enter a non-active state. That is, there is no case when the writing gate and the hold gate simultaneously enter an active state. Thereby, when the pulse is transferred from any transfer unit circuit to the next transfer unit circuit, it can be prevented that the pulse passes through the next transfer unit circuit and is then transferred to the one after the next transfer unit circuit. In addition, since it is not required to instantaneously switch the states of the writing gate and the hold gate at the time of transferring the pulse, it is possible to reduce the power consumption of the circuit supplying the control signals to the writing gate and the hold gate, and to decrease noise.

Preferably, in a case in which the writing gate has a first transistor of a P-channel type and a second transistor of an N-channel type, and the hold gate has a third transistor of an N-channel type and a fourth transistor of a P-channel type, the method of controlling a shift register further includes: when the writing gate is shifted from the active state to the non-active state and the hold gate is shifted from the non-active state to the active state, performing control such that the first transistor is shifted from an ON state to an OFF state, performing control such that the second transistor is shifted from an ON state to an OFF state, performing control such that the third transistor is shifted from an OFF state to an ON state, and performing control such that the fourth transistor is shifted from an OFF state to an ON state; and when the writing gate is shifted from the non-active state to the active state and the hold gate is shifted from the active state to the non-active state, performing control such that the third transistor is shifted from the ON state to the OFF state, performing control such that the fourth transistor is shifted from the ON state to the OFF state, performing control such that the first transistor is shifted from the OFF state to the ON state, and performing control such that the second transistor is shifted from the OFF state to the ON state.

According to this aspect, when the writing gate is shifted from an active state to a non-active state and the hold gate is shifted from a non-active state to an active state, states of ON and OFF are decided in order of the first transistor, the second transistor, the third transistor, and the fourth transistor. In addition, when the writing gate is shifted from a non-active state to an active state and the hold gate is shifted from an active state to a non-active state, the ON or OFF states are decided in order of the third transistor, the fourth transistor, the first transistor, and the second transistor. Thereby, at the time of transferring the pulse, the writing gate and the hold gate simultaneously enter a non-active state (off state), so that it is possible to prevent the pass-through of the pulse from being generated. In addition, since it is not required to instantaneously switch the states of the writing gate and the hold gate at the time of transferring the pulse, it is possible to reduce the power consumption of the circuit supplying the control signal to the writing gate and the hold gate, and to decrease noise.

Preferably, the method of controlling a shift register further includes: shifting states of the writing gate and the hold gate in a transfer unit circuit of the current stage after detecting that the writing gate has entered a non-active state in a transfer unit circuit of the next stage provided in a transfer direction of the pulse. In this case, since it is possible to detect whether a writing gate of the next stage is in an OFF state to start the transfer operation of the pulse, the pulse can be reliably transferred.

According to a second aspect of the invention, a shifter register including: a transfer unit in which a plurality of transfer unit circuits, each having a storage unit and a writing unit, are connected in series, the storage unit having a hold gate and storing a logical level of a pulse when the hold gate is in an active state and the writing unit having a writing gate and writing a pulse in the storage unit when the writing gate is in an active state; and a control unit having a plurality of control unit circuits which are provided to correspond to the plurality of transfer unit circuits and control whether the hold gate and the writing gate are in an active state or a non-active state. In addition, when the writing gate is shifted from an active state to a non-active state and the hold gate is shifted from a non-active state to an active state, the control unit circuit performs control such that the hold gate is shifted from a non-active state to an active state after performing control such that the writing gate is shifted from an active state to a non-active state, and when the writing gate is shifted from a non-active state to an active state and the hold gate is shifted from an active state to a non-active state, the control unit circuit performs control such that the writing gate is shifted from a non-active state to an active state after performing control such that the hold gate is shifted from an active state to a non-active state. At the time of transferring the pulse, the states of the writing gate and the hold gate need to be shifted. However, according to this shift register, there is no case that the writing gate and the hold gate simultaneously enter an active state. Thereby, when the pulse is transferred from any transfer unit circuit to the next transfer unit circuit, it can be prevented that the pulse passes through the one after the next transfer unit circuit and is then transferred to the next transfer unit circuit. In addition, since it is not required to instantaneously switch the states of the writing gate and the hold gate at the time of transferring the pulse, it is possible to reduce the power consumption of the circuit supplying the control signal to the writing gate and the hold gate, and to decrease noise.

Preferably, the writing gate has a first transistor of a P-channel type and a second transistor of an N-channel type and the hold gate has a third transistor of an N-channel type and a fourth transistor of a P-channel type. When the writing gate is shifted from an active state to a non-active state and the hold gate is shifted from a non-active state to an active state, the control unit circuit performs control such that the second transistor is shifted from an ON state to an OFF state after performing control such that the first transistor is shifted from an ON state to an OFF state, and performs control such that the fourth transistor is shifted from an OFF state to an ON state after performing control such that the third transistor is shifted from an OFF state to an ON state. In addition, when the writing gate is shifted from a non-active state to an active state and the hold gate is shifted from an active state to a non-active state, the control unit circuit performs control such that the fourth transistor is shifted from an ON state to an OFF state after performing control such that the third transistor is shifted from an ON state to an OFF state, and performs control such that the second transistor is shifted from an OFF state to an ON state after performing control such that the first transistor is shifted from an OFF state to an ON state. Thereby, at the time of transferring the pulse, the writing gate and the hold gate simultaneously enter a non-active state (off state), so that it is possible to prevent the pass-through of the pulse from being generated. In addition, since it is not required to instantaneously switch the states of the writing gate and the hold gate at the time of transferring the pulse, it is possible to reduce the power consumption of the circuit supplying the control signal to the writing gate and the hold gate, and to decrease noise.

Preferably, the control unit circuit has a clock input circuit that outputs a clock signal and a clock supply circuit that supplies a first non-inverted control clock signal to the first transistor, supplies a first inverted control clock signal to the second transistor, supplies a second non-inverted control clock signal to the third transistor, and supplies a second inverted control clock signal to the fourth transistor. In addition, the clock supply circuit has a NAND circuit that has one input terminal supplied with the clock signal and outputs the first non-inverted control clock signal; a first inverting circuit that inverts the first non-inverted control clock signal and outputs the first inverted control clock signal; a NOR circuit that has one input terminal supplied with the clock signal and the other input terminal supplied with the first inverted control clock signal and outputs the second non-inverted control clock signal; and a second inverting circuit that inverts the second non-inverted clock control signal to generate the second inverted control clock signal and supplies the generated second inverted control clock signal to the other input terminal of the NAND circuit. In this case, the clock supply circuit is composed of flip-flops and can decide logical levels of the first and second non-inverted control clock signals and the first and second inverted control clock signals in a predetermined order.

Preferably, a non-inverted input clock signal and an inverted input clock signal obtained by inverting the non-inverted input clock signal are alternately supplied to the clock input circuit provided in each of the plurality of control unit circuits as supply clock signals. In addition, the clock input circuit has a first enable signal generating circuit that detects whether a first condition is satisfied and generates a first enable signal of negative logic to allow the supply clock signal to be input; a second enable signal generating circuit that detects whether a second condition is satisfied and generates a second enable signal of positive logic to allow the supply clock signal to be input; a NOR circuit to which the supply clock signal and the first enable signal are input; a NAND circuit to which the supply clock signal and the second enable signal are input; and a selection circuit that selects any one of an output signal of the NOR circuit and an output signal of the NAND circuit ON the basis of a transfer signal instructing a transfer direction of the pulse and outputs the selected output signal as the clock signal.

In the shift register, the first and second non-inverted control clock signals (for example, a first clock signal CK1 and a third clock signal CK3 illustrated in an embodiment to be described later) and the first and second inverted control clock signals (for example, a second clock signal CK2 and a fourth clock signal CK4 illustrated in the embodiment) supplied to the unit transfer unit circuits are supplied from the clock control circuits. In each of the clock control circuits, the non-inverted input clock signal (for example, a non-inverted clock signal CK in the embodiment) or the inverted input clock signal (for example, an inverted clock signal CKB in the embodiment) is input as the supply clock signal regardless of the transfer direction. Here, the supply clock signal is supplied to the NOR circuit and the NAND circuit, the output signals of the NOR circuit and the NAND circuit are selected according to the transfer direction, and a clock signal of one system is generated. The NOR circuit operates logical product of the inversions of input signals and outputs the operation result while the NAND circuit operates logical product of input signals and outputs the inversion of the operation result. That is, even though the output signals of the NOR circuit and the NAND circuit are switched in accordance with the transfer direction, the logical levels of the clock signal and the supply clock signal are equal to each other. In addition, the non-inverted control clock signal and the inverted control clock signal are generated ON the basis of a clock signal of one system. Thereby, even though the transfer direction is switched, phase relationships among the supply clock signal, the non-inverted control clock signal, and the inverted control clock signal can be fixed.

Preferably, a control unit circuit of any stage shifts states of the writing gate and the hold gate in a transfer unit circuit of the current stage after detecting that the writing gate had entered a non-active state in a transfer unit circuit of the next stage provided in a transfer direction of the pulse. In this case, since the transfer operation of the pulse starts after detecting that the writing gate of the next stage is in an OFF state, the pulse can be reliably transferred.

According to a third aspect of the invention, an electro-optical device includes: a plurality of scanning lines; a plurality of data lines; a plurality of electro-optical elements that are provided to correspond to intersections of the plurality of scanning lines and the plurality of data lines; a scanning line driving circuit that drives the plurality of scanning lines; and a data line driving circuit that drives the plurality of data lines. The scanning line driving circuit has the above-mentioned shift register, and generates a plurality of scanning signals such that the plurality of scanning signals enter an active state for a period for which shift signals output from adjacent transfer unit circuits simultaneously enter an active state and supplies the plurality of scanning signals to the plurality of corresponding scanning lines. According to this aspect, since the above-mentioned shift register is used, the power consumption can be reduced and the noise can be decreased. In addition, it is possible to prevent the erroneous operation of the scanning signal from being generated, thereby improving the quality of a display screen.

According to a fourth aspect of the invention, an electro-optical device includes: a plurality of scanning lines; a plurality of data lines; a plurality of electro-optical elements that are provided to correspond to intersections of the plurality of scanning lines and the plurality of data lines; a scanning line driving circuit that drives the plurality of scanning lines; and a data line driving circuit that drives the plurality of data lines. In addition, the data line driving circuit has the above-mentioned shift register, and generates a plurality of sampling signals such that the plurality of sampling signals enter an active state for a period for which shift signals output from adjacent transfer unit circuits simultaneously enter an active state and supplies a plurality of data signals obtained by sampling image signals in accordance with the plurality of sampling signals to the plurality of corresponding data lines. According to this aspect, since the above-mentioned shift register is used, the power consumption can be reduced and the noise can be decreased. In addition, it is possible to prevent the erroneous operation of the scanning signal from being generated, thereby improving the quality of a display screen.

According to a fifth aspect of the invention, an electronic apparatus comprises the above-mentioned electro-optical device. Examples of this electronic apparatus include, for example, a video camera, a projector, or the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Bi-Directional Shift Register

First, a bi-directional shift register 1 according to the invention will be described. The bi-directional shift register 1 switches a transfer direction of a start pulse SP in accordance with a transfer direction control signal DIR which instructs a transfer direction. Specifically, the bi-directional shift register shifts the start pulse SP to a right direction (from a left direction to a right direction) when the transfer direction control signal DIR is an H level, and shifts the start pulse SP to a left direction (from a right direction to a left direction) when the transfer direction control signal DIR is an L level.

Figure 1:
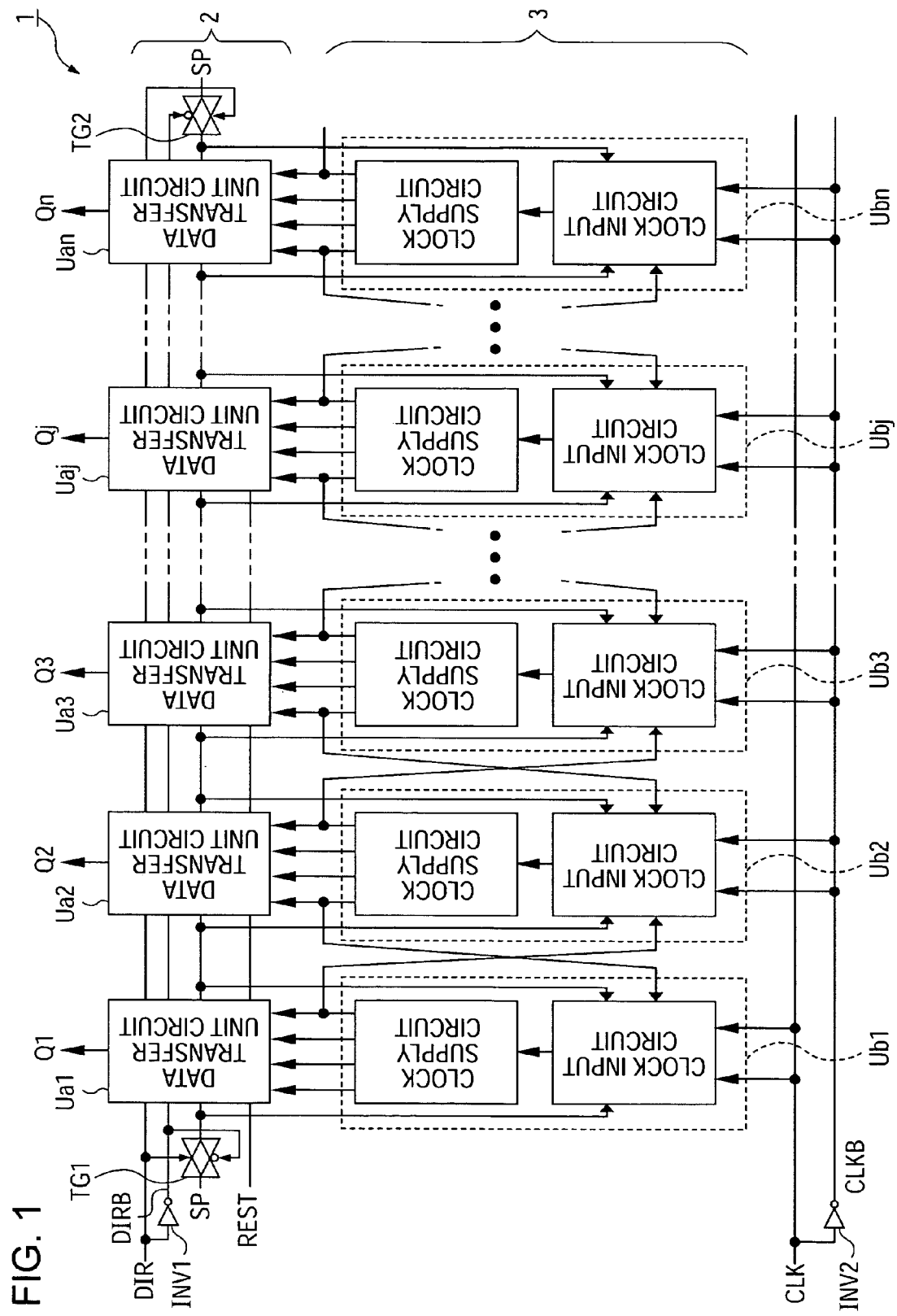
FIG. 1 is a block diagram illustrating a structure of a bi-directional shift register 1 according to the invention.

FIG. 1 is a block diagram illustrating the bi-directional shift register 1. As shown in FIG. 1, the bi-directional shift register 1 includes a data transfer unit 2 and a clock control unit 3. In this case, the data transfer unit 2 includes n data transfer unit circuits Ua1, Ua2, ..., Uaj (j is a natural number which is not less than two and is less than n), and Uan, transfer gates TG1 and TG2, and an inverter INV1. The inverter INV1 inverts a logical level of the transfer direction control signal DIR to generate an inverted transfer direction control signal DIRB. When the transfer direction control signal DIR is an H level, the transfer gate TG1 is turned on, and the transfer gate TG2 is turned off. In contrast, when the transfer direction control signal DIR is an L level, the transfer gate TG1 is turned off, and the transfer gate TG2 is turned on. That is, in a case in which the transfer direction control signal DIR is an H level and instructs a right shift, the start pulse SP is supplied to the data transfer unit circuit Ua1 located at the right end. Further, in a case in which the transfer direction control signal DIR is an L level and instructs a left shift, the start pulse SP is supplied to the data transfer unit circuit Uan located at the left end.

Figure 2:
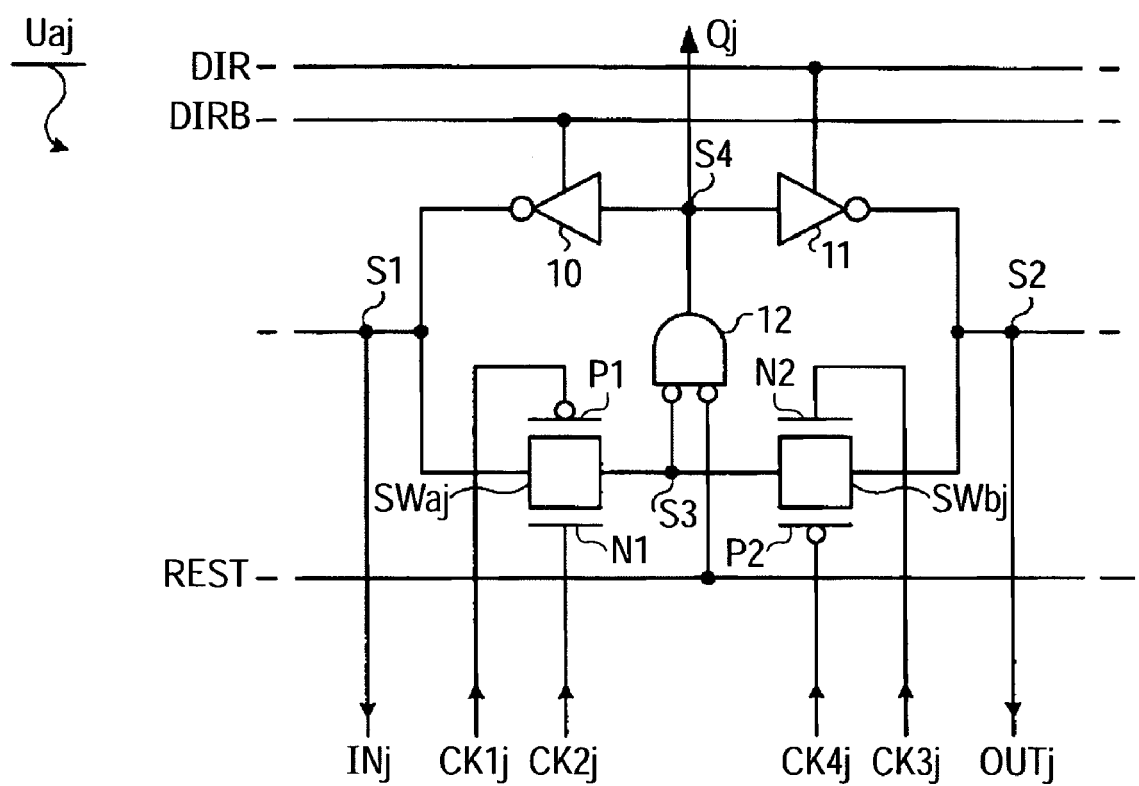
FIG. 2 is a circuit diagram illustrating a structure of a data transfer circuit Uaj used in the bi-directional shift register 1.

FIG. 2 shows a circuit diagram of the j-th data transfer unit circuit Uaj. In addition, the other data transfer unit circuits also have the same structure as the j-th data transfer unit circuit Uaj. As shown in FIG. 2, the data transfer unit circuit Uaj includes clocked inverters 10 and 11, a NOR circuit 12, P-channel transistors P1 and P2, and N-channel transistors N1 and N2. When a transfer direction is set to a right direction, the transistors P1 and N1 constitute a writing switch SWaj, and the writing switch SWaj is provided between a first terminal Si and a first connecting point S3. The transistors P2 and N2 constitute a hold switch SWbj, and the hold switch SWbj is provided between the first connecting point S3 and a second terminal S2. In addition, the NOR circuit 12 provided between the first connecting point S3 and the second connecting point S4 functions as an inverting circuit when a reset signal REST enters a non-active state. In addition, the clocked inverter 10 is provided between the second connecting point S4 and the first terminal S1 and the clocked inverter 11 is provided between the second connecting point S4 and the second terminal S2.

Further, a first clock signal CK1j, a second clock signal CK2j, a third clock signal CK3j, and a fourth clock signal CK4j are supplied to the transistor P1, the transistor N1, the transistor N2, and the transistor P2, respectively. The first to fourth clock signals CK1j to CK4j are supplied from a clock control circuit Ubj provided so as to correspond to the data transfer unit circuit Uaj, and an input signal INj and an output signal OUTj of the data transfer unit circuit Uaj are supplied to the clock control circuit Ubj.

A shift signal Qj is extracted from the NOR circuit 12. One input terminal of the NOR circuit 12 is supplied with a reset signal REST, and the other input terminal of the NOR circuit 12 is connected to a connecting point between the writing switches SWaj and SWbj. When the reset signal REST is an H level, it enters an active state. If the reset signal REST of the H level is supplied, a logical level of the shift signal Qj forcibly enters an L level. At the time of power supply, logical levels of the shift signals Q1 to Qn of the respective data transfer unit circuits Ua1 to Uan are not constant but different. In this case, the reset signal REST is used for arranging logical levels of the output signals Q1 to Qn to an L level.

In addition, the clocked inverter 10 functions as an inverter when the inverted transfer direction control signal DIRB is an H level, and its output terminal enters a high-impedance state when the inverted transfer direction control signal DIRB is an L level. In contrast, the clocked inverter 11 functions as an inverter when the transfer direction control signal DIR is an H level, and its output terminal enters a high-impedance state when the transfer direction control signal DIR is an H level.

Figure 3A:
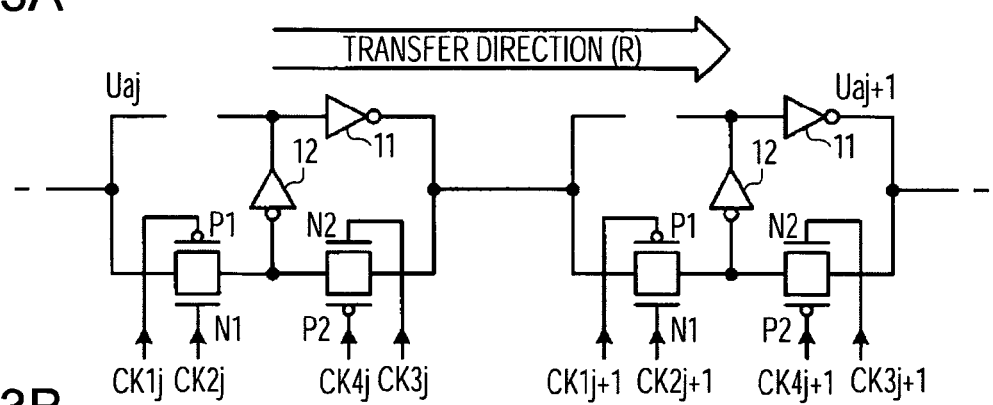
FIG. 3A is an equivalent circuit diagram of data transfer unit circuits Uaj and Uaj+1 in a case in which a transfer direction control signal DIR is an H level.
Figure 3B:
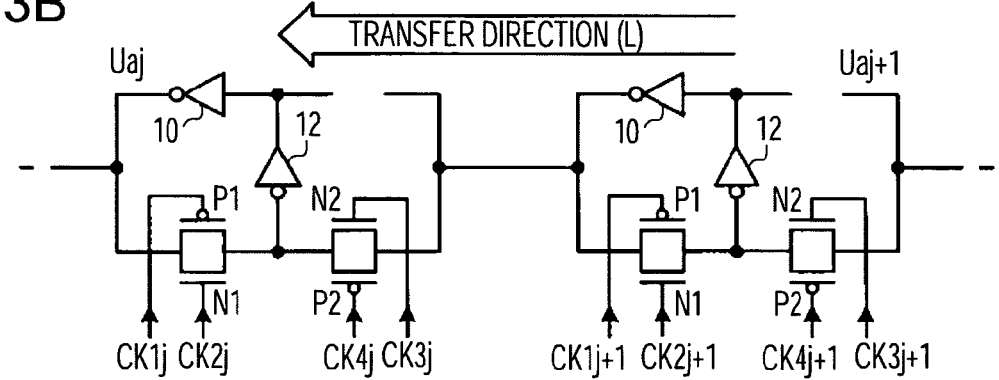
FIG. 3B is an equivalent circuit diagram of the data transfer unit circuits Uaj and Uaj+1 in a case in which the transfer direction control signal DIR is an L level.

If the reset signal REST enters a non-active state (L level) and the transfer direction control signal DIR is an H level, the transfer direction becomes a right direction. As a result, an equivalent circuit of the data transfer unit circuits Uaj and Uaj+1 is as shown in FIG. 3A. In this case, the clocked inverter 10 enters a non-active state, and the NOR circuit 12 functions as an inverter. In addition, if the reset signal REST enters a non-active state (L level) and the transfer direction control signal DIR is an L level, the transfer direction becomes a left direction. As a result, an equivalent circuit of the data transfer unit circuits Uaj and Uaj+1 is as shown in FIG. 3B.

Next, the clock control unit 3 shown in FIG. 1 will be described. The clock control unit 3 includes an inverter INV2 that inverts a non-inverted clock signal CK to output an inverted clock signal CKB, and a plurality of clock control circuits Ub1, Ub2, ..., Ubj, ..., and Ubn. Each of the clock control circuits Ub1 to Ubn is provided so as to correspond to each of the plurality of data transfer unit circuits Ua1 to Uan and has a clock supply circuit 20 and a clock input circuit 30. Odd-numbered-stage clock control circuits Ub1, Ub3, Ub5, ... are supplied with the non-inverted clock signal CK while even-numbered-stage clock control circuits Ub2, Ub4, Ub6, ... are supplied with the inverted clock signal CKB. In this case, 'j' is an odd number.

Figure 4:
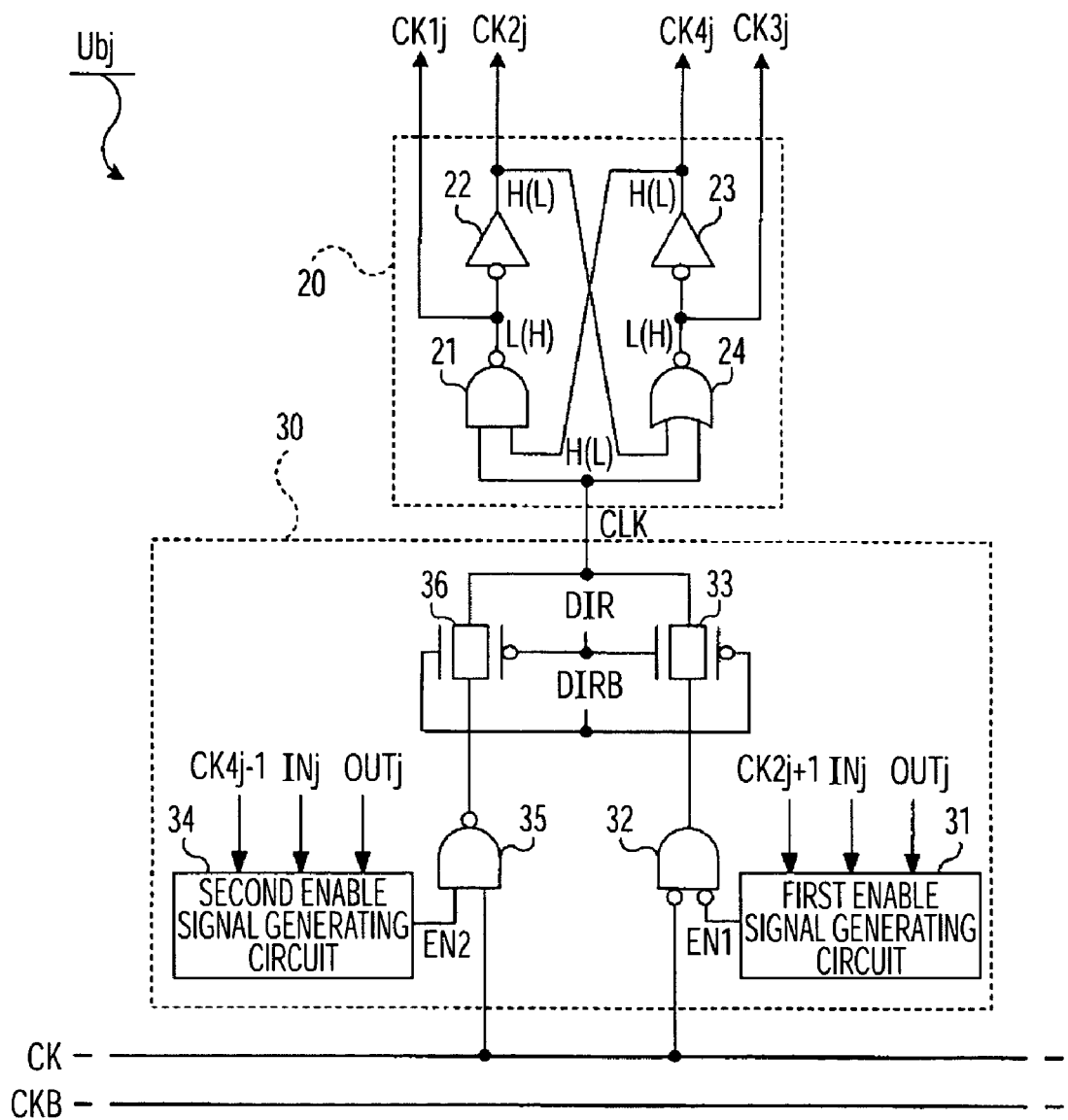
FIG. 4 is a circuit diagram illustrating a structure of a clock control circuit Ubj used in the bi-directional shift register 1.

FIG. 4 is a block diagram of the j-th clock control circuit Ubj. The clock input circuit 30 includes a first enable signal generating circuit 31, a NOR circuit 32, a transfer gate 33, a second enable signal generating circuit 34, a NAND circuit 35, and a transfer gate 36. The transfer gate 33 enters an ON state when the transfer direction control signal DIR is an H level, that is, the transfer direction is a right direction, and enters an OFF state when the transfer direction control signal DIR is an L level, that is, the transfer direction is a left direction. In addition, the transfer gate 36 enters an ON state when the inverted transfer direction control signal DIRB is an H level, that is, the transfer direction is a left direction, and enters an OFF state when the inverted transfer direction control signal DIRB is an L level, that is, the transfer direction is a right direction. Therefore, when the transfer direction is a right direction, the output signal of the NOR circuit 32 is supplied to the clock supply circuit 20 as the clock signal CLK, and when the transfer direction is a left direction, the output signal of the NAND circuit 35 is supplied to the clock supply circuit 20 as the clock signal CLK. The transfer gates 33 and 36 function as a selection unit that selects the output signals of the NOR circuit 32 or the output signals of the NAND circuit 36 and outputs the selected signal as the clock signal CLK in accordance with the transfer direction control signal DIR.

Figure 5A:
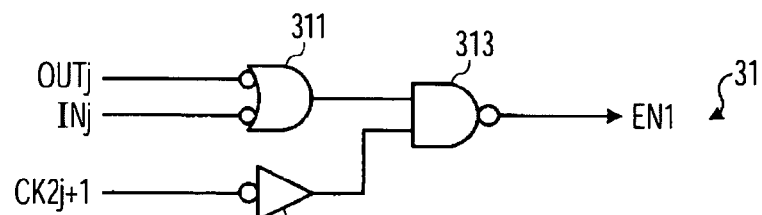
FIG. 5A is a circuit diagram of a first enable signal generating circuit 31 used in the clock control circuit Ubj.

One input terminal of the NOR circuit 32 is supplied with a first enable signal EN1 that enters an active state at an L level, and the other input terminal of the NOR circuit 32 is supplied with the non-inverted clock signal CK. The first enable signal EN1 is a signal for allowing the non-inverted clock signal CK to be input. As shown in FIG. 5A, the first enable signal generating circuit 31 includes NAND circuits 311 and 313 and an inverter 312. First, if any one of the input signal INj and output signal OUTj of the data transfer unit circuit Uaj of a corresponding stage enters an active state (L level), an output signal of the NAND circuit 311 enters an active state (H level). In this case, one input terminal of the NAND circuit 313 is supplied with an output signal of the NAND circuit 311, and the other input terminal of the NAND circuit 313 is supplied with a second clock signal CK2j+1. The second clock signal CK2j+1 is a signal that instructs a data transfer unit circuit Uaj+1 of the next stage to write an input signal INj +1 when the transfer direction is a right direction, and enters an active state at an H level. Therefore, when any one of the input signal INj and output signal OUTj of the data transfer unit circuit Uaj of the corresponding stage enters an active state and the transfer direction is set to a right direction, the first enable signal generating circuit 31 functions as a unit that detects that the data transfer unit circuit Uaj+1 of the next stage has entered a writing-disabled state.

Figure 5B:
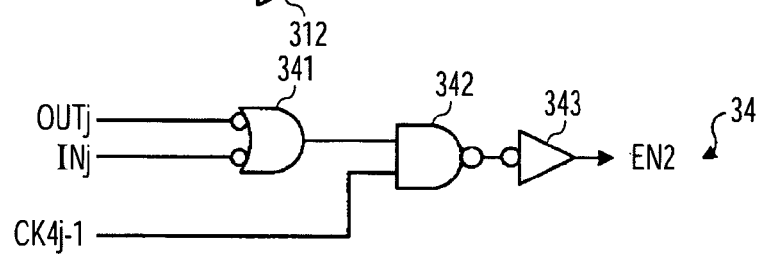
FIG. 5B is a circuit diagram of a second enable signal generating circuit 34 used in the clock control circuit Ubj.

As shown in FIG. 5B, the second enable signal generating circuit 34 includes NAND circuits 341 and 342 and an inverter 343. First, if any one of the input signal INj and output signal OUTj of the data transfer unit circuit Uaj of the corresponding stage enters an active state (L level), an output signal of the NAND circuit 341 enters an active state (H level). In this case, one input terminal of the NAND circuit 342 is supplied with an output signal of the NAND circuit 341, and the other input terminal of the NAND circuit 342 is supplied with a fourth clock signal CK4j−1. The fourth clock signal CK4j−1 is a signal that instructs a data transfer unit circuit Uaj−1 of the next stage to write an input signal INj−1 when the transfer direction is set to a left direction, and enters an active state at an L level. Therefore, when any one of the input signal INj and output signal OUTj of the data transfer unit circuit Uaj of the corresponding stage enters an active state and the transfer direction is set to a left direction, the second enable signal generating circuit 34 functions as a unit that detects that the data transfer unit circuit Uaj−1 of the next stage has entered a writing-disabled state.

By the first enable signal generating circuit 31 and the second enable signal generating circuit 34 described above, the input of the non-inverted clock signal CK is stopped in a case in which the input signal INj and the output signal OUTj of the data transfer unit circuit Uaj of the corresponding stage enter a non-active state. At this time, the logical level of the clock signal CLK which is output from the clock input circuit 30 is fixed, and a logical level of each node of the clock supply circuit 20 and the data transfer unit circuit Uaj is fixed. That is, among the plurality of data transfer unit circuits Ua1 to Uan and the plurality of clock control circuits Ub1 to Ubn, only some circuits, which receive the pulse output from the front stage and transfer the received pulse to the rear stage, are operated, and the operation of the other circuits is stopped. As a result, power consumption is markedly reduced. In addition, the first enable signal generating circuit 31 and the second enable signal generating circuit 34 detect that the data transfer unit circuit of the next stage has entered a writing-disabled state and allow the non-inverted clock signal CK to be input. Therefore, it is possible to prevent the erroneous operation from being generated due to the pass-through of the data.

Next, the NOR circuit 32 shown in FIG. 4 functions as a logical circuit which operates the logical product of the inversions of input signals and outputs the operation result. Therefore, if the first enable signal EN1 is in an active state, the NOR circuit 32 receives the non-inverted clock signal CK, and inverts the logical level of the received non-inverted clock signal to supply it to the transfer gate 33. In addition, the NAND circuit 35 functions as a logical circuit which operates the logical product of input signals and outputs the inversion of the operation result. Therefore, if the second enable signal EN2 is in an active state, the NAND circuit 35 receives the non-inverted clock signal CK, and inverts a logical level of the received non-inverted clock signal to supply it to the transfer gate 36. As described above, since the transfer gates 33 and 36 select the output signals of the NOR circuit 32 and the NAND circuit 36 and output the clock signal CLK, the clock signal CLK is generated on the basis of the non-inverted clock signal CK regardless of the transfer direction. This point is very important in the case in which the bi-directional shift register 1 is used as a driving circuit of an image display device. That is, since the type of clock signal input to the clock control circuit Ubj is fixed regardless of the transfer direction, the relationship among the shift signals Q1 to Qn, the non-inverted clock signal CK, and a timing is fixed. As a result, even when the arrangement of pixels is a delta arrangement, image inversion can easily be performed without causing a problem.

Figure 6:
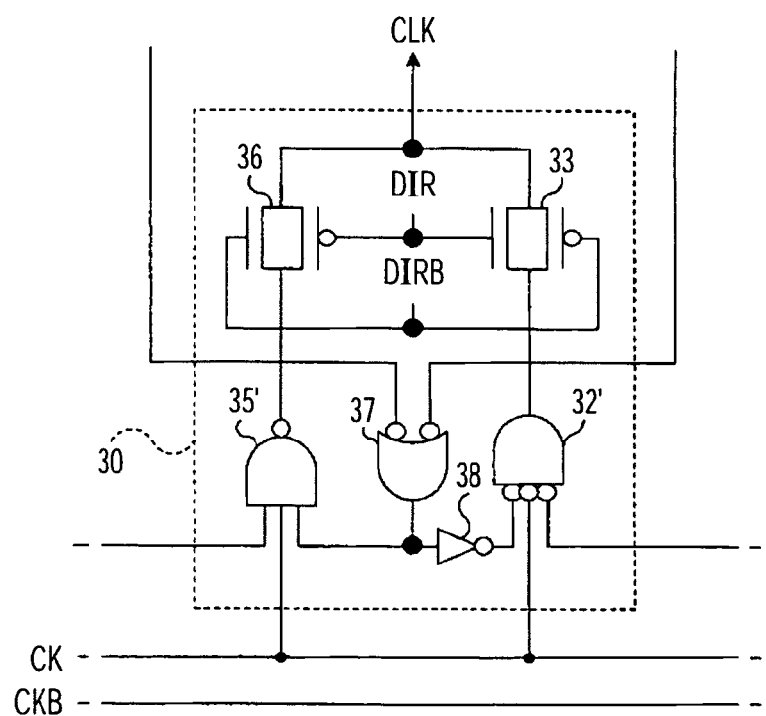
FIG. 6 is a circuit diagram illustrating an example of a structure of a clock input circuit 30.

However, the first enable signal generating circuit 31 and the second enable signal generating circuit 34 has NAND circuits 311 and 341 that operate the logical sum of negative logic between the input signal INj and the output signal OUTj, as shown in FIG. 5A and FIG. 5B. That is, since the NAND circuits 311 and 341 have the same function, any one of them may be commonly used. Therefore, the clock input circuit 30 may be constructed as shown in FIG. 6. The clock input circuit 30 shown in FIG. 6 has a triple-input-type NOR circuit 32' and a triple-input-type NAND circuit 35' instead of a double-input-type NOR circuit 32 and a double-input-type NAND circuit 35. In addition, in order to supply the inversion of a signal to the NOR circuit 32', an inverter 38 is provided. By constructing the clock input circuit 30 in this way, its structure can be simplified and the power consumption can be reduced.

Figure 7:
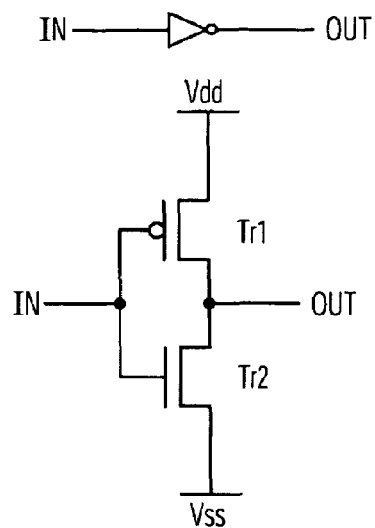
FIG. 7 is a circuit diagram of an inverter.
Figure 8A:
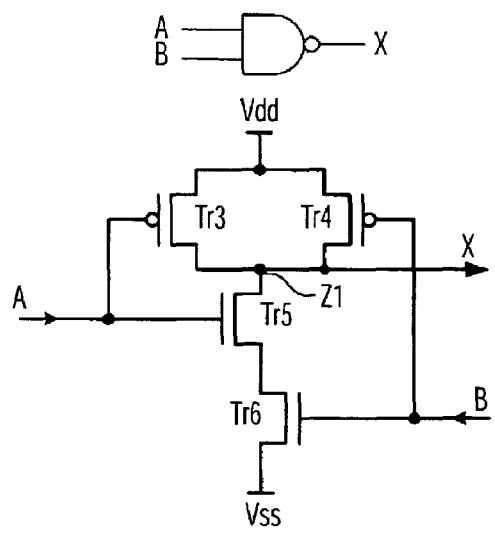
FIG. 8A is a circuit diagram of a NAND circuit.
Figure 8B:
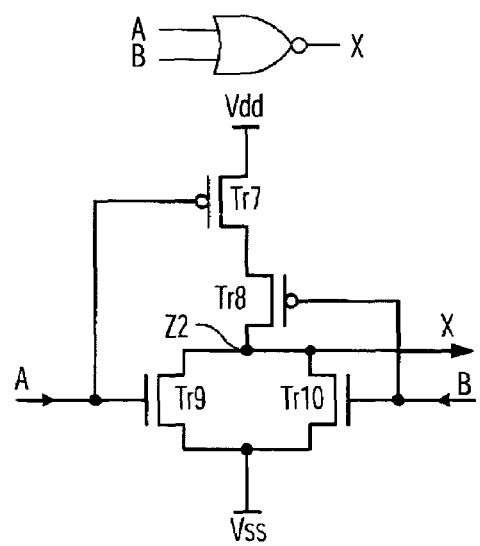
FIG. 8B is a circuit diagram of a NOR circuit.

Next, the clock supply circuit 20 shown in FIG. 4 will be described. The clock supply circuit 20 includes a NAND circuit 21, inverters 22 and 23, and a NOR circuit 24. The inverters 22 and 23 have a structure in which a P-channel-type transistor Tr1 and an N-channel-type transistor Tr2 are connected in series to each other between a high-potential-side power supply Vdd and a low-potential-side power supply Vss, as shown in FIG. 7. In addition, the NAND circuit 21 includes P-channel-type transistors Tr3 and Tr4 connected in parallel to each other between the high-potential-side power supply Vdd and a node Z1, and N-channel-type transistors Tr5 and Tr6 connected in series to each other between the node Z1 and the low-potential-side power supply Vss, as shown in FIG. 8A. Further, the NOR circuit 24 includes P-channel-type transistors Tr7 and Tr8 connected in series to each other between the high-potential-side power supply Vdd and a node Z2, and N-channel-type transistors Tr9 and Tr10 connected in parallel to each other between the node Z2 and the low-potential-side power supply Vss, as shown in FIG. 8B.

Figure 9:
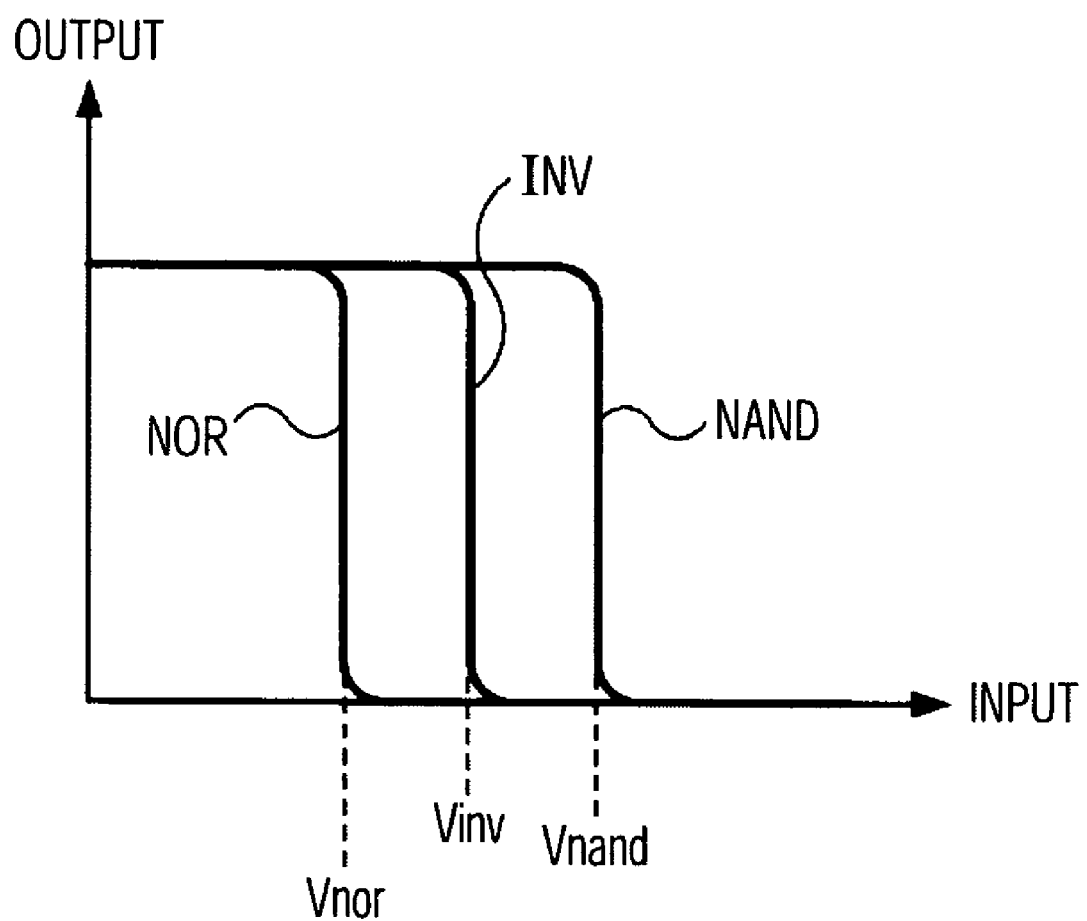
FIG. 9 is a graph illustrating threshold value potentials of the inverter, the NAND circuit, and the NOR circuit.

FIG. 9 illustrates input and output characteristics of the NAND circuit 21, the inverters 22 and 23, and the NOR circuit 24. In addition, in FIG. 9, Vinv indicates a threshold value potential of the inverters 22 and 23, Vnand indicates a threshold value potential of the NAND circuit 21, and Vnor indicates a threshold value potential of the NOR circuit 24. The threshold value potential Vnand is higher than the threshold value potential Vinv. This is because the N-channel-type transistors Tr4 and Tr5 are connected in series to each other between the node Z1 and the low-potential-side power supply Vss, as shown in FIG. 8A. In addition, the threshold value potential Vnor is lower than the threshold value potential Vinv. This is because the P-channel-type transistors Tr7 and Tr8 are connected in series to each other between the node Z2 and the high-potential-side power supply Vdd, as shown in FIG. 8B.

Figure 10:
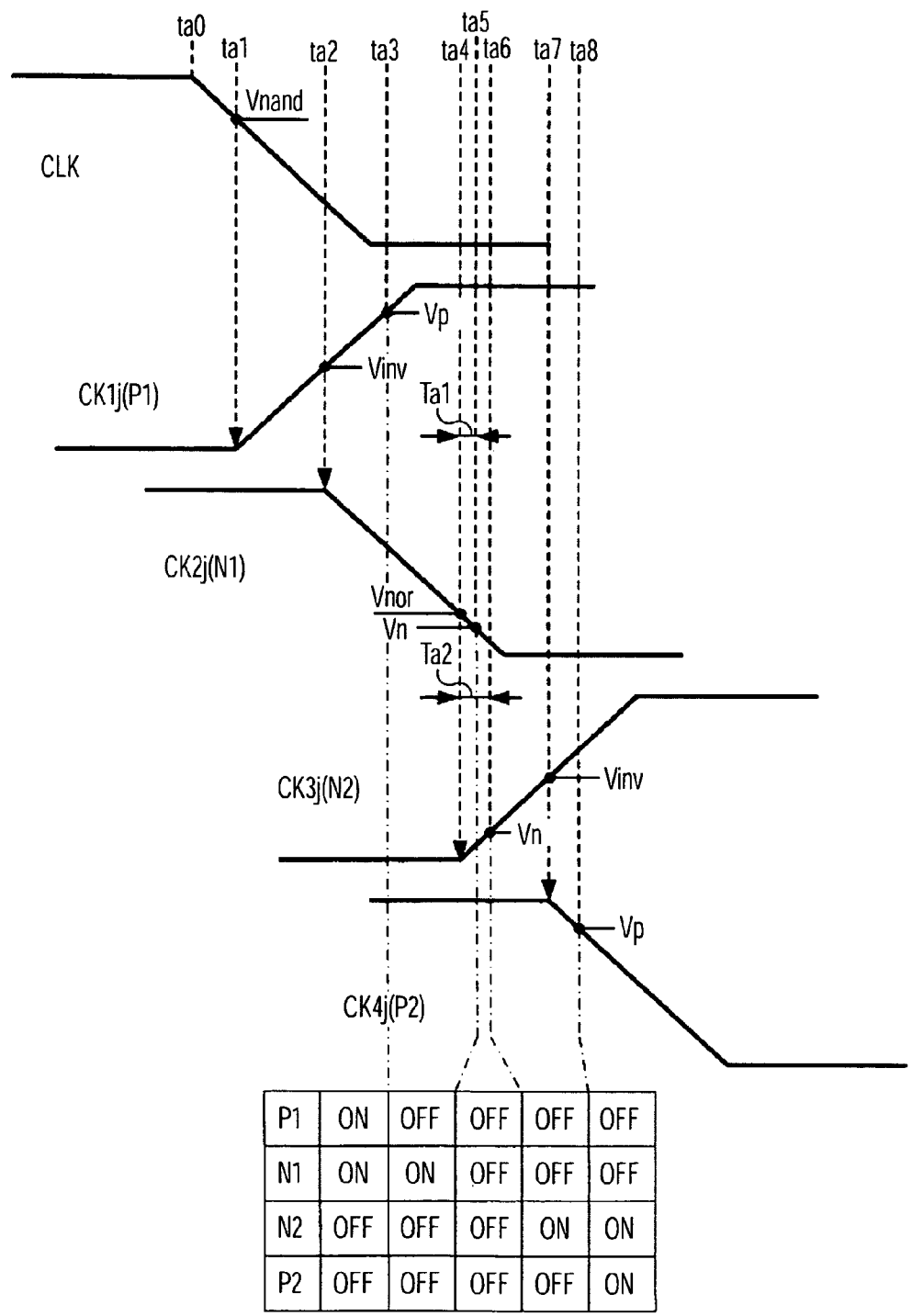
FIG. 10 is a timing chart of first to fourth clock signals in a case in which a logical level of a clock signal CLK is shifted from an H level to an L level.

Next, the operation of the clock supply circuit 20 will be described. FIG. 10 is a timing chart in a case in which the logical level of the clock signal CLK is shifted from an H level to an L level. In addition, the threshold value potentials of the P-channel-type transistors P1 and P2 and the N-channel-type transistors N1 and N2 shown in FIG. 2 are set to Vp and Vn, respectively. First, in an initial state, the logical level of the clock signal CLK is an H level. At this time, the transistor P1 enters an ON state when the first clock signal CK1j is an L level, the transistor N1 enters an ON state when the second clock signal CK2j is an H level, the transistor N2 enters an OFF state when the third clock signal CK3j is an L level, and the transistor P2 enters an OFF state when the fourth clock signal CK4j is an H level.

If the clock signal CLK starts to fall from a time ta0 and reaches a threshold value potential Vnand at a time ta1, a first clock signal CK1j output from the NAND circuit 21 starts to rise. In addition, if the level of the first clock signal CK1j reaches a threshold value potential Vinv at a time ta2, the second clock signal CK2j output from the inverter 22 starts to fall. At this point of time, the level of the first clock signal CK1j does not reach the threshold value potential Vp, but reaches the threshold value potential Vp at a time ta3. If so, the transistor P1 is turned off.

At a time ta4, the level of the second clock signal CK2j reaches a threshold value potential Vnor, and a third clock signal CK3j output from the NOR circuit 24 starts to rise. Here, if comparing a time period Ta1 when the level of the second clock signal CK2j changes from the threshold value potential Vnor to the threshold value potential Vn with a time period Ta2 when the level of the third clock signal CK3j changes from an L level to the threshold value potential Vn, the time period Ta1 is shorter than the time period Ta2. This is because the threshold value potential Vnor of the NOR circuit 24 is low, as shown in FIG. 9. Actually, even though there is a propagation delay time in the NOR circuit 24, the time period Ta1 becomes shorter than the time period Ta2 (Ta1<Ta2). For this reason, the transistor N1 is turned off at a time ta5, and the transistor N2 is turned on at a time ta6.

After that, at a time ta7, the level of the third clock signal CK3j reaches a threshold value potential Vinv, and a fourth clock signal CK4j output from the inverter 23 starts to fall. Then, at a time ta8, the level of the four clock signal CK4j reaches a threshold value potential Vp. Thereby, the transistor P2 is turned on. Therefore, signals are decided in order of the transistor P1, the transistor N1, the transistor N2, and the transistor P2. Here, since the transistors P1 and N1 constitute a writing switch and the transistors P2 and N2 constitute a hold switch, the writing switch changes from an ON state to an OFF state and then the hold switch changes from an OFF state to an ON state.

Figure 11:
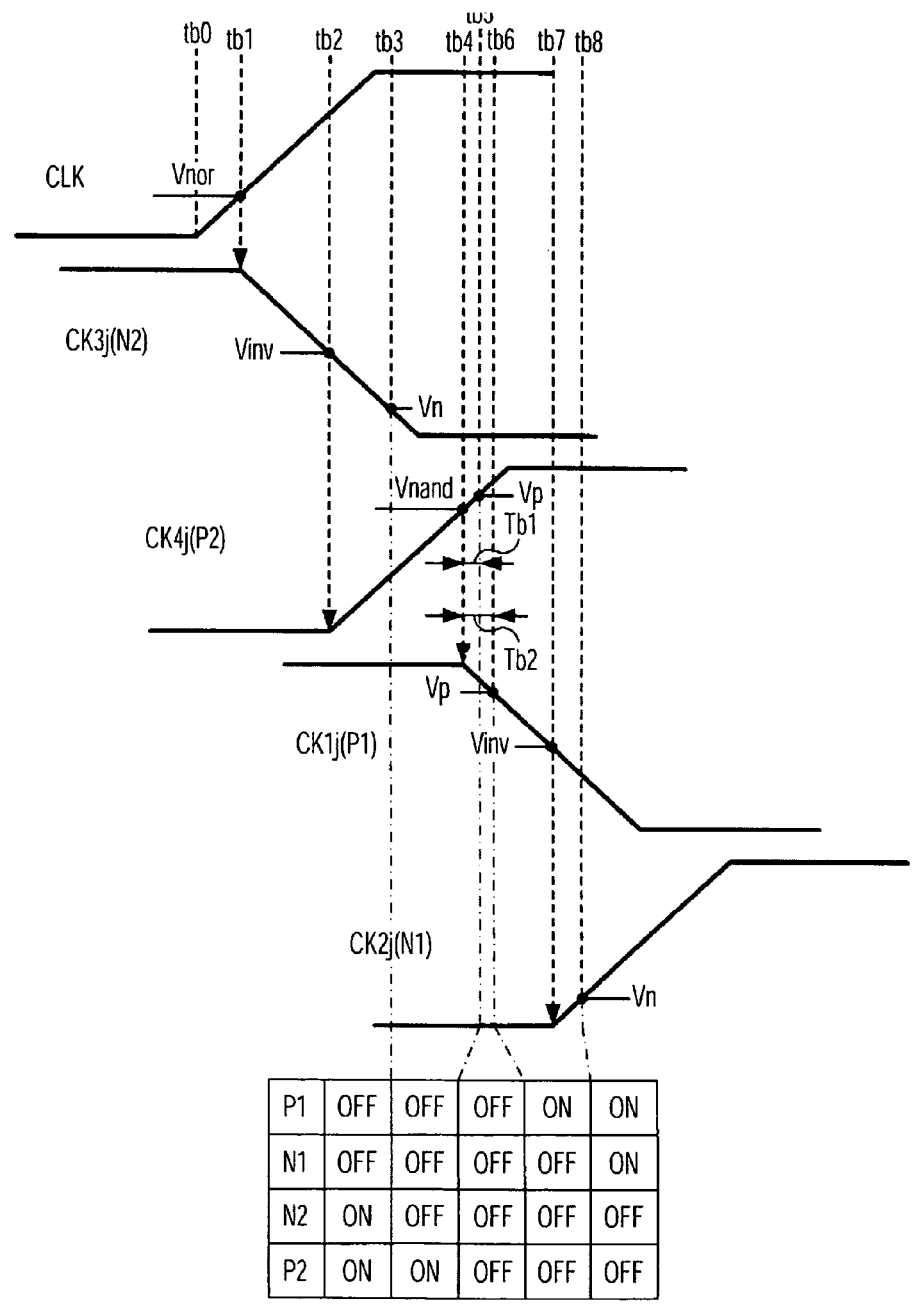
FIG. 11 is a timing chart of first to fourth clock signals in a case in which the logical level of the clock signal CLK is shifted from the L level to the H level.

FIG. 11 is a timing chart in a case in which the logical level of the clock signal CLK is shifted from an L level to an H level. First, in an initial state, the level of the clock signal CLK is an L level. At this time, the transistor N2 enters an ON state when the third clock signal CK3j is an H level, the transistor P2 enters an ON state when the fourth clock signal CK4j is an L level, the transistor P1 enters an OFF state when the first clock signal CK1j is an H level, and the transistor P1 enters an OFF state when the second clock signal CK2j is an L level.

If the clock signal CLK starts to rise from a time tb0 and reaches a threshold value potential Vnor at a time tb1, a third clock signal CK3j output from the NOR circuit 24 starts to fall. In addition, if the level of the third clock signal CK3j reaches a threshold value potential Vinv at a time tb2, the fourth clock signal CK4j output from the inverter 23 starts to rise. At this point of time, the level of the third clock signal CK3j does not reach the threshold value potential Vn, but reaches the threshold value potential Vn at a time tb3. If so, the transistor N2 is turned off.

At a time tb4, the level of the fourth clock signal CK4j reaches a threshold value potential Vnand, and a first clock signal CK1j output from the NAND circuit 21 starts to fall. Here, if comparing a time period Tb1 when the level of the fourth clock signal CK4j changes from the threshold value potential Vnand to the threshold value potential Vp with a time period Tb2 when the level of the first clock signal CK1j changes from an H level to the threshold value potential Vp, the time period Tb1 is shorter than the time period Tb2. This is because the threshold value potential Vnand of the NAND circuit 21 is high, as shown in FIG. 9. Actually, even though there is a propagation delay time in the NAND circuit 21, the time period Tb1 becomes shorter than the time period Tb2 (Tb1<Tb2). For this reason, the transistor P2 is turned off at a time tb5, and the transistor P1 is turned on at a time tb6.

After that, at a time tb7, the level of the first clock signal CK1j reaches a threshold value potential Vinv, and the second clock signal CK2j output from the inverter 22 starts to rise. Then, at a time tb8, the level of the second clock signal CK2j reaches a threshold value potential Vn. Thereby, the transistor N1 is turned on. Therefore, signals are decided in order of the transistor N2, the transistor P2, the transistor P1, and the transistor N1. Here, since the transistors P1 and N1 constitute a writing switch SWaj and the transistors P2 and N2 constitute a hold switch SWbj, the writing switch SWaj changes from an ON state to an OFF state and then the hold switch SWbj changes from an OFF state to an ON state.

Figure 12:
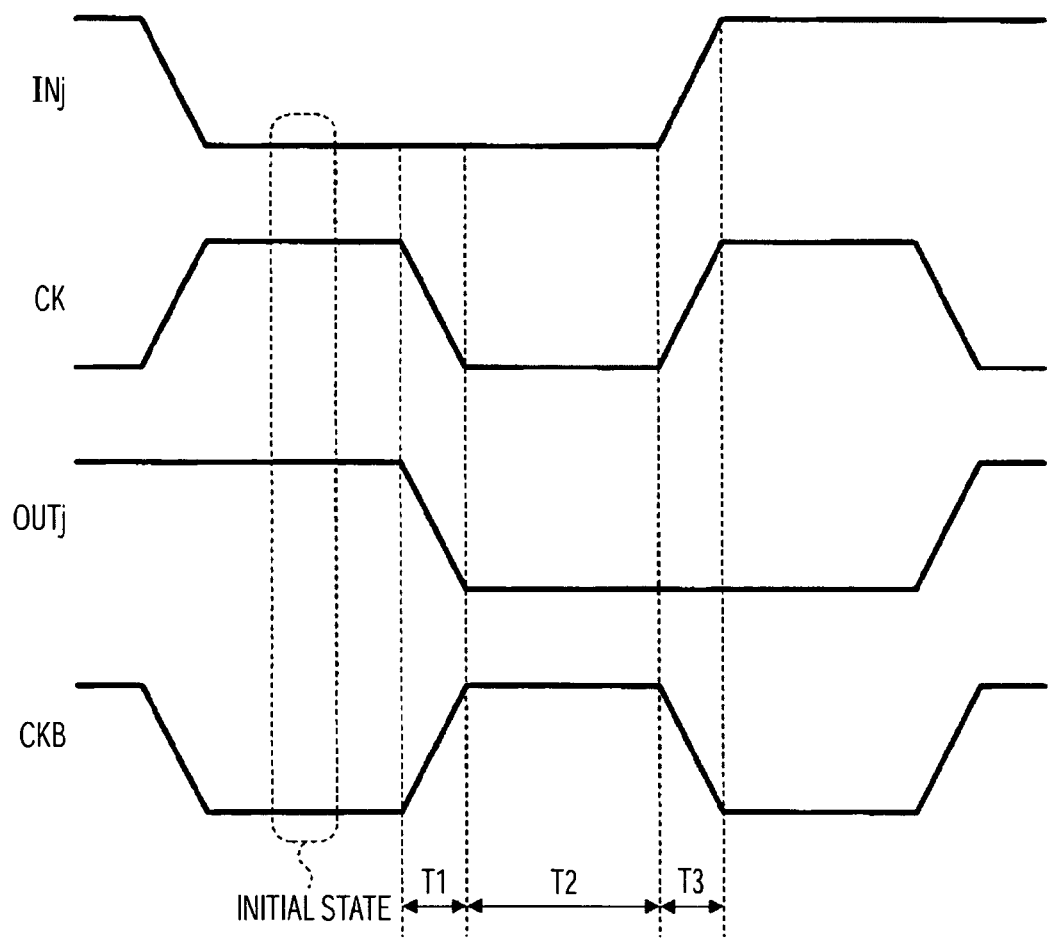
FIG. 12 is a timing chart illustrating the transfer operation of the data transfer unit circuits Uaj and Uaj+1.

Next, the transfer operation of the j-th data transfer unit circuit Uaj, which is driven by the first to fourth clock signals CK1j to CK4j, and the (j+1)-th data transfer unit circuit Uaj+1, which is adjacent to the j-th data transfer unit circuit Uaj, will be described. Here, the transfer direction of the start pulse SP is set to a right direction. In addition, as shown in FIG. 12, the input signal INj is input to the data transfer unit circuit Uaj and the shift operation is performed ON the basis of the non-inverted clock signal CK and the inverted clock signal CKB. Further, a falling period of the non-inverted clock signal CK is set to T1, a period for which the non-inverted clock signal is an L level is set to T2, and a rising period of the non-inverted clock signal CK is set to T3. Furthermore, at an initial state, the input signal INj is set to an L level and the non-inverted clock signal CK is set to an H level.

FIGS. 13A to 13F are equivalent circuit diagrams of the data transfer unit circuit Uaj and the (j+1)-th data transfer unit circuit Uaj+1. In FIGS. 13A to 13F, first, the transfer direction is a right direction. Therefore, in the clock input circuit 30 shown in FIG. 4, the transfer gate 33 is turned on and the transfer gate 36 is turned off. In this case, if the first enable signal EN1 enters an active state, in the data transfer unit circuit Uaj, the NOR circuit 32 receives the non-inverted clock signal CK to invert it, and the inverted signal is supplied to the clock supply circuit 20 as the clock signal CLK. In addition, in the data transfer unit circuit Uaj+1, the NOR circuit 32 receives the inverted clock signal CKB to invert it, and the inverted signal is supplied to the clock supply circuit 20 as the clock signal CLK.

Figure 13:
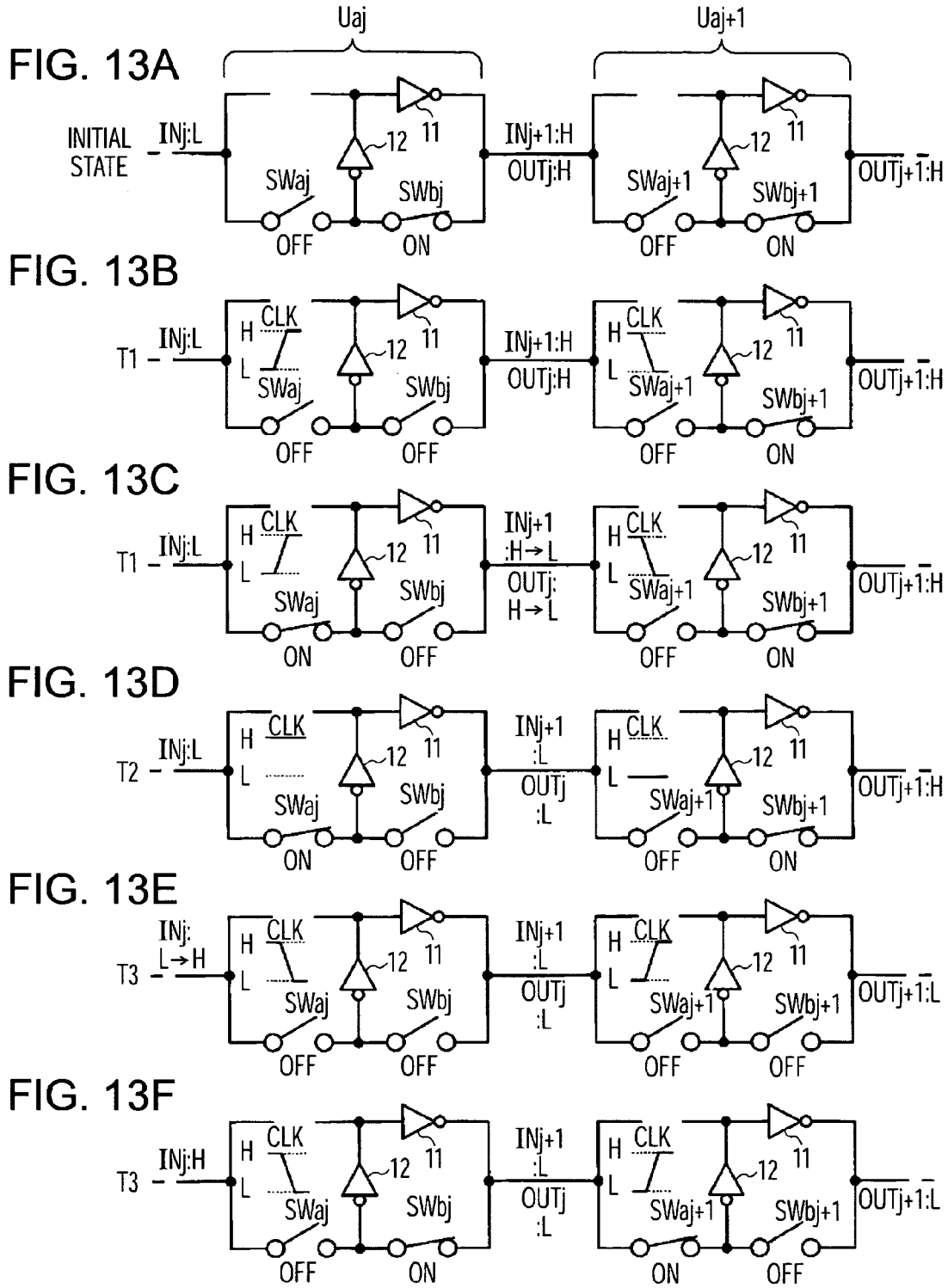
FIG. 13 is an equivalent circuit diagram of the data transfer unit circuits Uaj and Uaj+1 at the time of the transfer operation.

As shown in FIG. 13A, at an initial state, the writing switches SWaj and SWaj+1 enter an OFF state and the hold switches SWbj and SWbj+1 enter an ON state.

Next, at the period T1, the data transfer unit circuit Uaj is controlled in accordance with a rising waveform of the clock signal CLK while the data transfer unit circuit Uaj+1 is controlled in accordance with a falling waveform of the clock signal CLK. At this time, since an input signal INj+1 and an output signal OUTj+1 of the data transfer unit circuit Uaj+1 are in a non-active state (H level), states of the writing switch SWaj+1 and the hold switch SWbj+1 do not change. In contrast, in the data transfer unit circuit Uaj, since the input signal INj is in an active state (L level) and the writing switch SWaj+1 of the next stage is in an OFF state, the first enable signal EN1 enters an active state. For this reason, the level of the clock signal CLK rises from an L level to an H level. As described with reference to FIG. 11, when the clock signal CLK rises, the transistor N2 changes from an ON state to an OFF state, and then the transistor P2 changes from an ON state to an OFF state. Accordingly, as shown in FIG. 13B, the hold switch SWbj enters an OFF state. Next, the transistor P1 changes from an OFF state to an ON state and then the transistor N1 changes from an OFF state to an ON state. At this time, as shown in FIG. 13C, the writing switch SWaj enters an ON state. If so, the input signal INj is output as an output signal OUTj through the NOR circuit 12 and the inverter 11.

Next, at the period T2, the level of the clock signal CLK does not change. Therefore, the states of the data transfer unit circuit Uaj and the data transfer unit circuit Uaj+1 are sustained (see FIG. 13D).

Next, at the period T3, the output signal OUTj of the data transfer unit circuit Uaj is in an active state (L level), and the input signal INj+1 of the data transfer unit circuit Uaj+1 enters an active state. For this reason, the data transfer unit circuit Uaj is controlled in accordance with a falling waveform of the clock signal CLK while the data transfer unit circuit Uaj+1 is controlled in accordance with the rising waveform of the clock signal CLK.

First, since the output signal OUTj is in an active state (L level) and the writing switch SWaj+1 of the next stage is in an OFF state in the data transfer unit circuit Uaj, the first enable signal EN1 enters an active state. For this reason, the clock signal CLK falls from an H level to an L level. As described with reference to FIG. 10, when the clock signal CLK falls, the transistor P1 changes from an ON state to an OFF state, and then the transistor N1 changes from an ON state to an OFF state. Accordingly, as shown in FIG. 13E, the hold switch SWbj enters an OFF state. Next, the transistor N2 changes from an OFF state to an ON state and then the transistor P2 changes from an OFF state to an ON state. At this time, as shown in FIG. 13F, the hold switch SW2 enters an ON state. If so, the NOR circuit 12 and the inverter 11 constitute a latch circuit and an L level is stored to the latch circuit.

Next, since the output signal OUTj is in an active state (L level) and the writing switch SWaj+2 of the next stage (not shown) is in an OFF state in the data transfer unit circuit Uaj+1, the first enable signal EN1 enters an active state. For this reason, the clock signal CLK rises from an L level to an H level. When the clock signal CLK rises, the transistor N2 changes from an ON state to an OFF state, and then the transistor P2 changes from an ON state to an OFF state. Accordingly, as shown in FIG. 13E, the hold switch SWbj+1 enters an OFF state. Next, the transistor P1 changes from an OFF state to an ON state and then the transistor N1 changes from an OFF state to an ON state. At this time, as shown in FIG. 13F, the writing switch SWaj+1 enters an ON state. If so, the input signal INj+1 is output as an output signal OUTj+1 through the NOR circuit 12 and the inverter 11.

Hereinafter, the above-mentioned operation is repeated, and the transfer pulse is sequentially transferred to the data transfer unit circuits Uaj+2, Uaj+3, ..., and Uan of the next stages. It is important to detect whether a writing switch of the next stage is in an OFF state and to shift a state of a writing switch or hold switch of the corresponding stage from an ON state to an OFF state, in view of preventing the pass-through of the transfer pulse. The writing switch and the hold switch are toggle switches. However, according to the above-mentioned operation, there is a period for which both the switches are simultaneously turned off while the states of the switches are shifted (for example, see FIGS. 13B and 13E). That is, while the states of the switches are shifted, both the switches cannot be simultaneously turned on. If there is a period for which the writing switch and the hold switch are simultaneously turned on, the writing switches SWaj and SWaj+1 and the hold switches SWbj and SWbj +1 shown in FIG. 13E are turned on. As a result, a transfer pulse which should be originally transferred from the data transfer unit circuit Uaj to the data transfer unit circuit Uaj+1 may be transferred to the data transfer unit circuit Uaj+2. According to the present embodiment, since there is a period for which both the switches are simultaneously turned off while the states of the switches are shifted, the pass-through of the transfer pulse is prevented, so that the transfer can be surely performed. In addition, since the order of turning ON and OFF of the first to fourth transistors P1, N1, N2, and P2 can be fixed, it is not necessary to use a logical circuit having the large drive capability like the waveform shaping circuit according to the related art. For this reason, the power consumption can be reduced and the generation of the noise can be suppressed.

Figure 14:
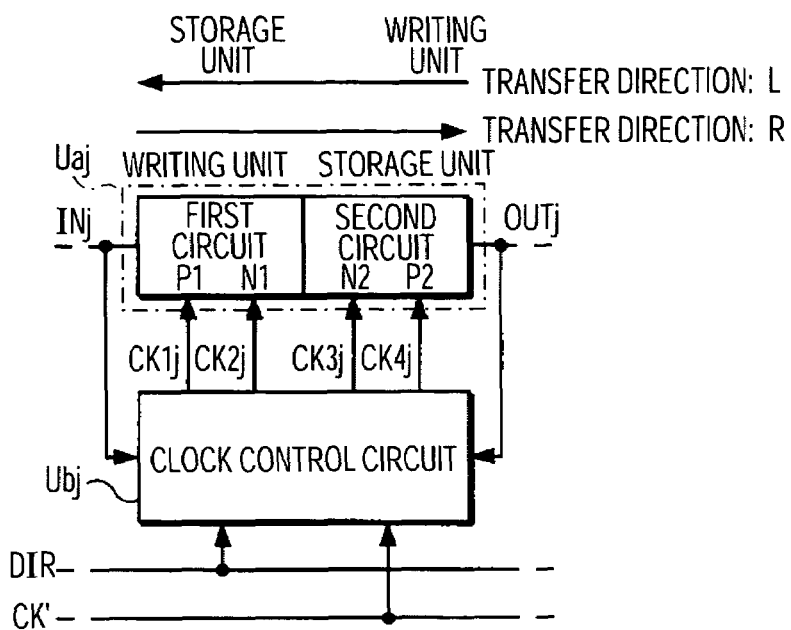
FIG. 14 is a block diagram illustrating functions of the data transfer unit circuits Uaj and Uaj+1.

FIG. 14 is a block diagram illustrating a function of the above-mentioned data transfer unit circuit Uaj and the clock control circuit Ubj. As shown in FIG. 14, the data transfer unit circuit Uaj includes a first circuit and a second circuit. The first circuit has the clocked inverter 10, the first transistor P1, the second transistor N1, and the NOR circuit 12, which are shown in FIG. 2. In addition, the second circuit has the clocked inverter 11, the third transistor N2, the fourth transistor P2, and the NOR circuit 12. In addition, the NOR circuit 12 functions as an inverting circuit when a reset signal is in a non-active state (L level), and is used for the first and second circuits.

In a case in which the transfer direction is a right direction, the second circuit functions as a storage unit that stores the logical level of the transfer pulse, and the third transistor N2 and the fourth transistor P2 constitute a hold switch. When the hold switch is in an ON state (active state), the storage unit allows the logical level to be stored, and when the hold switch is in an OFF state (non-active state), the storage unit does not allow the logical level to be stored. In addition, the first circuit functions as a writing unit that writes the logical level of the transfer pulse in the storage unit, and the first transistor P1 and the second transistor N1 constitute a writing switch. When the writing switch is in an ON state (active state), the writing unit writes the logical level of the transfer pulse in the storage unit, and when the writing unit is in an OFF state (non-active state), the writing unit does not write the logical level of the transfer pulse in the storage unit.

In a case in which the transfer direction is a left direction, the first circuit functions as a storage unit that stores a logical level of the transfer pulse, and the first transistor P1 and the second transistor N2 constitute a hold switch. In addition, the second circuit functions as a storage unit that stores the logical level of the transfer pulse, and the first transistor P1 and the second transistor N2 constitute a hold switch. In this way, the functions of the first and second circuits are switched to each other in accordance with the transfer direction.

Next, in the clock control circuit Ubj, any one of the non-inverted clock signal CK and the inverted clock signal CKB is input as a supply clock signal CK', a logical circuit where inverted signals are input (NOR circuit) and a logical circuit where non-inverted signals are input (NAND circuit) are selected in accordance with the transfer direction, and the clock signal CLK is generated. In addition, as described above, the clock supply circuit 20 generates first to fourth clock signals CK1j to CK4j ON on the basis of a clock signal CLK of one system, and supplies them to the above-mentioned writing switch and hold switch.

Next, examples of another structure of the data transfer unit circuit Uaj will be described.

Figure 15:
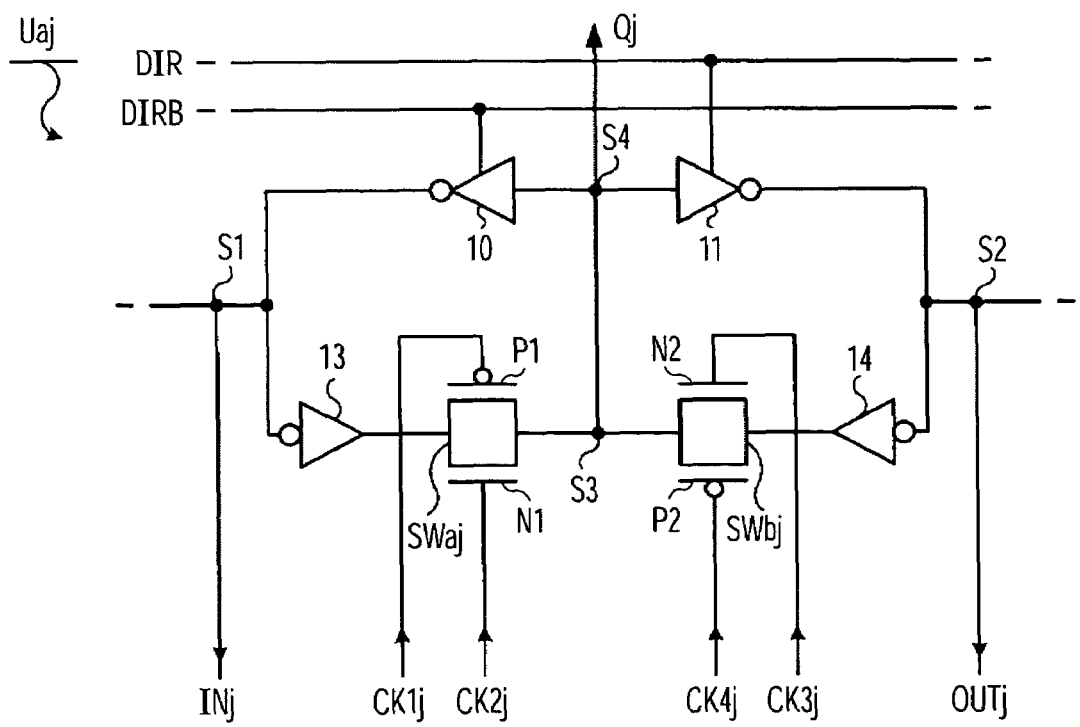
FIG. 15 is a circuit diagram illustrating a first example of another structure of the data transfer unit circuit Uaj.

FIG. 15 illustrates a first example of another structure of the data transfer unit circuit Uaj. The data transfer unit circuit Uaj shown in FIG. 15 has the same structure as the data transfer unit circuit Uaj shown in FIG. 2, except that inverters 13 and 14 are used instead of the NOR circuit 12. In this case, the clocked inverter 10, the switch SWaj, and the inverter 13 constitute a first circuit, and the clocked inverter 11, the switch SWbj, and the inverter 14 constitute a second circuit. In this example, the inverters 13 and 14 perform the function of the NOR circuit 12 as an inverting circuit.

Figure 16:
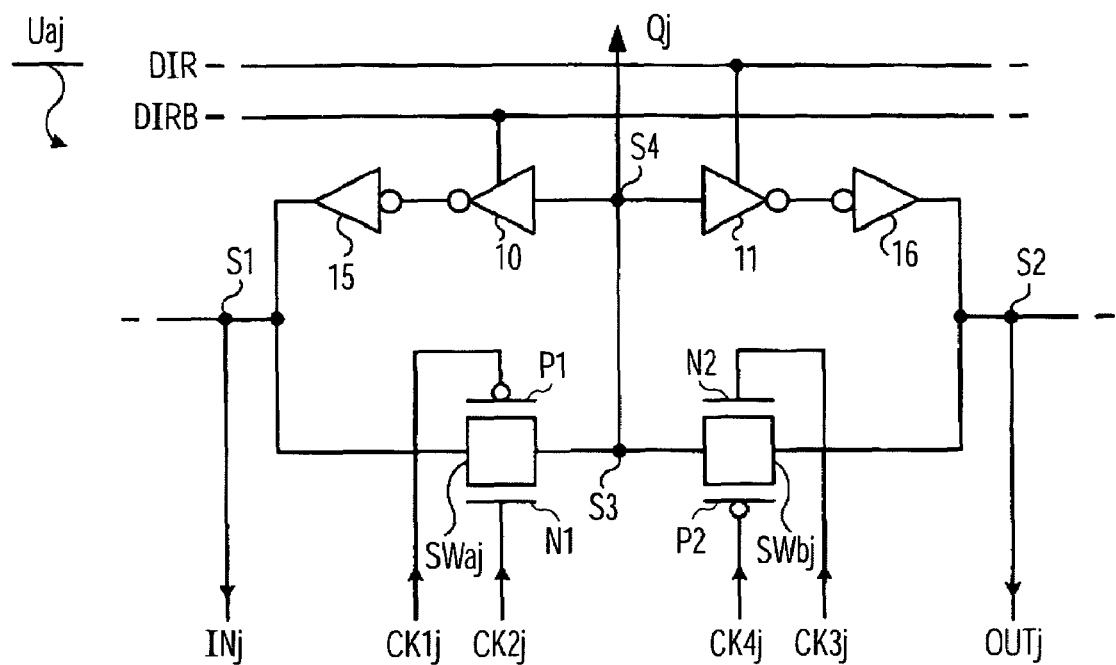
FIG. 16 is a circuit diagram illustrating a second example of another structure of the data transfer unit circuit Uaj.

FIG. 16 illustrates a second example of another structure of the data transfer unit circuit Uaj. The data transfer unit circuit Uaj shown in FIG. 16 has the same structure as the data transfer unit circuit Uaj shown in FIG. 2, except that inverters 15 and 16 are used instead of the NOR circuit 12. In this case, the clocked inverter 10, the switch SWaj, and the inverter 15 constitute a first circuit, and the clocked inverter 11, the switch SWbj, and the inverter 16 constitute a second circuit. In this example, the inverters 15 and 16 perform the function of the NOR circuit 12 as an inverting circuit.

Figure 17:
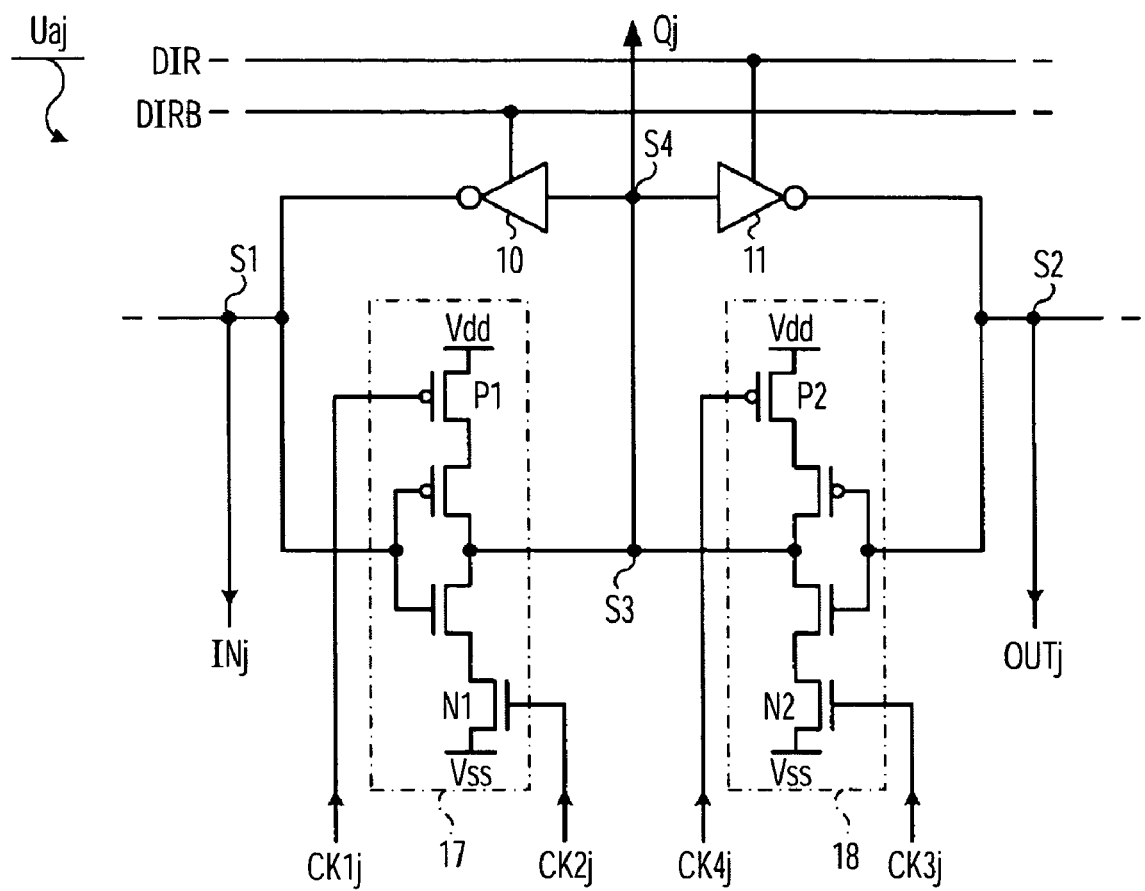
FIG. 17 is a circuit diagram illustrating a third example of another structure of the data transfer unit circuit Uaj.

FIG. 17 illustrates a third example of another structure of the data transfer unit circuit Uaj. The data transfer unit circuit Uaj shown in FIG. 17 has the same structure as the data transfer unit circuit Uaj shown in FIG. 2, except that clocked inverters 17 and 18 are used instead of the switches SWaj and SWbj and the NOR circuit 12. In this case, the clocked inverters 10 and 17 constitute a first circuit, and the clocked inverters 11 and 18 constitute a second circuit. In this example, the clocked inverter 15 performs the function of the NOR circuit 12 as an inverting circuit and the function of the switch SWaj, and the clocked inverter 18 performs the function of the NOR circuit 12 as an inverting circuit and the function of the switch SWbj.

Here, when the first circuit functions as a writing unit, the first transistor P1 and the second transistor N1 function as a writing gate. In addition, when the first circuit functions as a storage unit, the first transistor P1 and the second transistor N1 function as a hold gate. Further, when the second circuit functions as a writing unit, the third transistor N2 and the fourth transistor P2 function as a writing gate. In addition, when the second circuit functions as the storage unit, the third transistor N2 and the fourth transistor P2 function as a hold gate.

Figure 18:
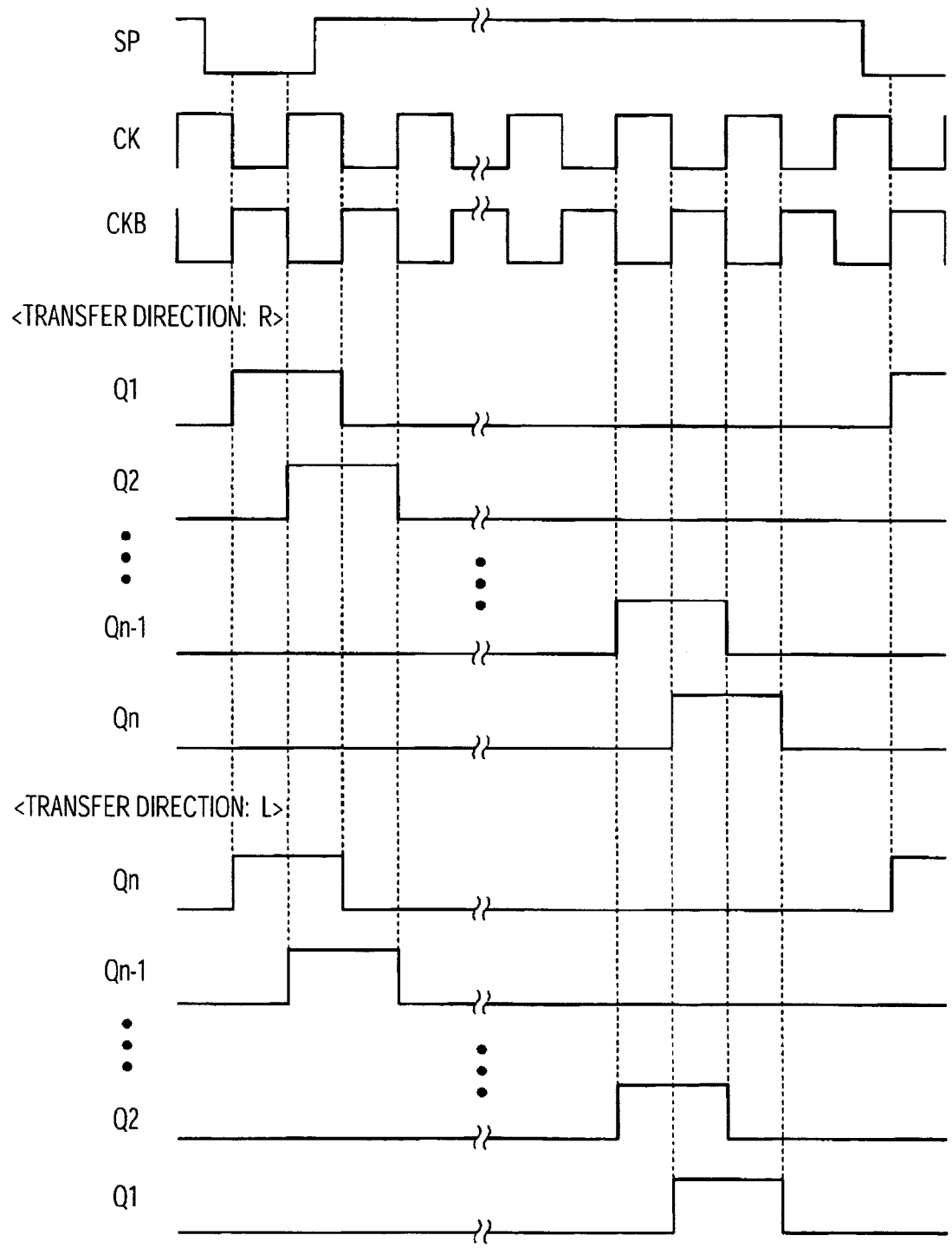
FIG. 18 is a timing chart illustrating the overall operation of the bi-directional shift register 1.

FIG. 18 is a timing chart illustrating the overall operation of the bi-directional shift register 1. As shown in FIG. 18, if a start pulse SP that enters an active state at an L level is input to the bi-directional shift register 1, shift signals Q1 to Qn are sequentially output in synchronization with the non-inverted clock signal CK and the inverted clock signal CKB. In a case in which the transfer direction is a right direction, since a start pulse SP is supplied to the data transfer unit circuit Ua1 located at a left end, the shift signals enter an active state in order of Q1, Q2, . . . , and Qn. Since each of the shift signals Q1 to Qn is an output signal of the NOR circuit 12, it enters an active state at an H level. In this case, a shift signal of any stage and a shift signal of the next stage overlap each other for a period corresponding to half of the cycle of the non-inverted clock signal CK. In addition, in a case in which the transfer direction is a left direction, since a start pulse SP is supplied to the data transfer unit circuit Ua1 located at a right end, the shift signals enter an active state in order of Qn, Qn−1, . . . , and Q1.

Here, even when the transfer direction is any one of the left and right directions, a phase relationship (phase difference) between the shift signals Q1 to Qn and the non-inverted clock signal CK or the inverted clock signal CKB is constant. For example, a rising edge Eu of the shift signal Q2 is in synchronization with a rising edge of the non-inverted clock signal CK regardless of the transfer direction, as shown in FIG. 18. Accordingly, the phase relationship does not deviate as much as half of the cycle of the non-inverted clock signal CK or the inverted clock signal CKB in accordance with the transfer direction.

Electro-Optical Device

Next, an electro-optical device will be described in which the above-mentioned bi-directional shift register 1 is used to a driving circuit.

Figure 19:
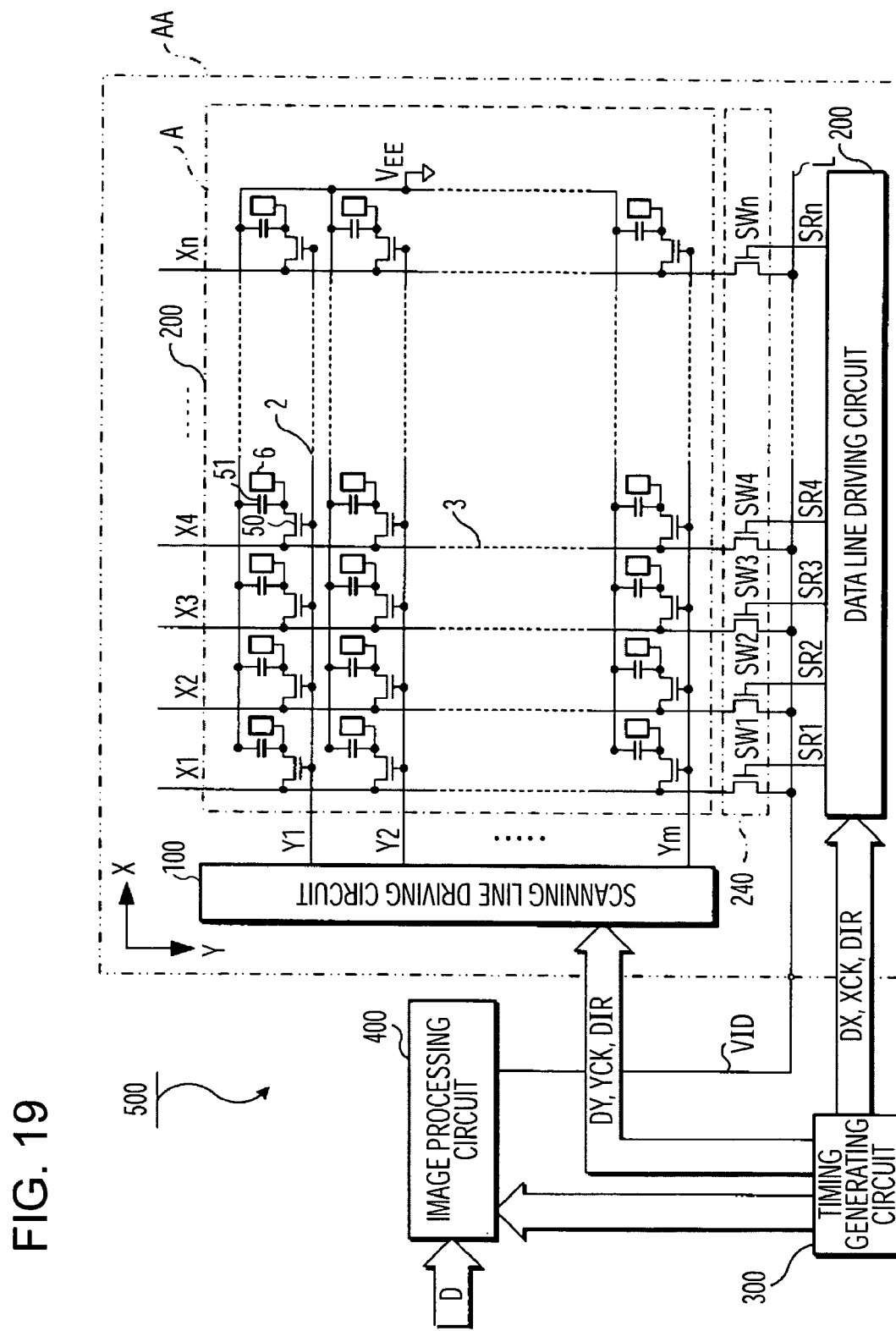
FIG. 19 is a block diagram illustrating a structure of an electro-optical device 500 according to the invention.

FIG. 19 is a block diagram illustrating an electrical structure of an electro-optical device 500 according to the invention. This electro-optical device 500 uses liquid crystal as an electro-optical material. The electro-optical device 500 has a liquid crystal panel AA as a main unit. The liquid crystal panel AA has a structure in which an element substrate where a plurality of thin film transistors (hereinafter, referred to as 'TFT') each serving as a switching element are formed and a counter substrate are disposed such that electrode forming surfaces of them are opposite to each other and are bonded to each other with a predetermined gap therebetween, and the liquid crystal is interposed in the gap.

Further, the electro-optical device 500 includes the liquid crystal panel AA, a timing generating circuit 300, and an image processing circuit 400. The liquid crystal panel AA has an image display region A, a scanning line driving circuit 100, a data line driving circuit 200, a sampling circuit 240, and an image signal supply line L, which are provided ON the element substrate. Input image data D supplied to the electro-optical device 500 has, for example, a 3-bit parallel format. The timing generating circuit 300 generates a Y clock signal YCK, an X clock signal XCK, a Y transfer start pulse DY, an X transfer start pulse DX, and a transfer direction control signal DIR in synchronization with the input image data D, and supplies them to the scanning line driving circuit 100 and the data line driving circuit 200. In addition, the timing generating circuit 300 generates various timing signals for controlling the image processing circuit 400 and outputs them. Further, the Y clock signal YCK and the X clock signal XCK correspond to the above-mentioned non-inverted clock signal CK, and the Y transfer start pulse DY and the X transfer start pulse DX correspond to the above-mentioned start pulse SP.

Here, the Y clock signal YCK specifies a period for selecting a scanning line 2 and the X clock signal XCK specifies a period for selecting a data line 3. In addition, the Y transfer start pulse DY is a pulse that instructs starting of selection of the scanning line 2, and the X transfer start pulse DX is a pulse that instructs starting of selection of the data line 3. Further, the transfer direction control signal DIR is a signal that instructs selection order of the scanning line 2 and the data line 3. When a logical level of the transfer direction control signal DIR is an H level, the transfer direction control signal DIR instructs selecting the scanning lines 2 sequentially in order of an upper side to a lower side and selecting the data lines 3 sequentially in order of a left side to a right side. In the following description, a display aspect in this case is called non-inverted image display. In contrast, when the logical level of the transfer direction control signal DIR is an L level, the transfer direction control signal DIR instructs selecting the scanning lines 2 sequentially in order of a lower side to an upper side and selecting the data lines 3 sequentially in order of a right side to a left side. In the following description, a display aspect in this case is called inverted image display. In this example, the common transfer direction control signal DIR is supplied to the scanning line driving circuit 100 and the data line driving circuit 200. However, the timing generating circuit 300 may generate a signal for scanning line selection and a signal for data line selection individually and may supply each corresponding signal to the scanning line driving circuit 100 and the data line driving circuit 200.

Next, the image processing circuit 400 performs gamma correction corresponding to having considered a light transmitting characteristic of the liquid crystal panel with respect to the input image data D, performs a D/A conversion with respect to image data of respective colors of RGB, and generates an image signal VID to supply it to the liquid crystal panel AA.

Next, as shown in FIG. 19, in the image display region A, m (m is a natural number equal to or greater than two) scanning lines 2 are arranged parallel to each other in an X direction, and n (n is a natural number equal to or greater than two) data lines 3 are arranged parallel to each other in a Y direction. In addition, near an intersection of each scanning line 2 and each data line 3, a gate of a TFT 50 is connected to the scanning line 2, a source of the TFT 50 is connected to the data line 3, and a drain of the TFT 50 is connected to a pixel electrode 6. In addition, each pixel is composed of the pixel electrode 6, a counter electrode formed ON the counter substrate (which will be described in detail below), and liquid crystal interposed between the pixel electrode 6 and the counter electrode. As a result, the pixels are arranged in a matrix so as to correspond to the intersections of the scanning lines 2 and the data lines 3.

In addition, the scanning lines 2, each to which the gate of the TFT 50 is connected, are line-sequentially applied with scanning signals Y1, Y2, . . . , and Ym in a pulsed manner. For this reason, if the scanning signal is supplied to any scanning line 2, since a TFT 50 connected to the corresponding scanning line is turned on, image signals X1, X2, . . . , and Xn supplied from the data lines 3 at a predetermined timing are sequentially written in the corresponding pixels and are then held for a predetermined period.

Since alignment or order of liquid crystal molecules changes in accordance with a voltage level applied to each pixel, gray-scale display through optical modulation can be achieved. For example, in a normally white mode, the amount of light passing through liquid crystal is restricted as the applied voltage increases. In contrast, in a normally black mode, the restriction of the amount of light passing through liquid crystal is alleviated as the applied voltage increases. As a result, in the entire electro-optical device 500, light having a contrast according to the image signal is emitted from each pixel, which results in predetermined display. In addition, in order to prevent the held image signal from leaking, a storage capacitor 51 is additionally provided parallel to a liquid crystal capacitor formed between the pixel electrode 6 and the counter electrode. For example, the voltage of the pixel electrode 6 is held by the storage capacitor 51 for a longer time, namely, for a period as much as three orders of magnitude longer than the period for which the source voltage is applied. Therefore, the held characteristic is improved, which results in a high contrast ratio.

Next, the data line driving circuit 200 generates sampling signals SR1 to SRn which sequentially enter an active state in synchronization with the X clock signal XCK. In addition, according to the transfer direction control signal DIR, the data line driving circuit 200 can control the order in which the sampling signals SR1 to SRn enter an active state. Specifically, when the transfer direction control signal DIR is in an H level, the sampling signals enter enters an active state in order of SR1, SR2, ..., and SRn, and when the transfer direction control signal DIR is in an L level, the sampling signals enter an active state in order of SRn, SRn−1, ..., and SR1.

The sampling circuit 240 has n switches SW1 to SWn. Each of the switches SW1 to SWn is composed of a TFT. In addition, when the sampling signals SR1 to SRn supplied to the gates sequentially enter an active state, the switches SW1 to SWn are sequentially turned on. If so, the image signal VID supplied through the image signal supply line L is sampled and is then sequentially supplied to the data lines 3. Accordingly, if the sampling signals enter an active state in order of SR1, SR2, ..., and SRn, the data lines 3 are sequentially selected in order of from a left direction to a right direction. In addition, if the sampling signals enter an active state in order of SRn, SRn−1, ..., and SR1, the data lines 3 are sequentially selected in order of a right direction to a left direction. Further, the sampling circuit 240 may be included in the data line driving circuit 200.

Figure 20:
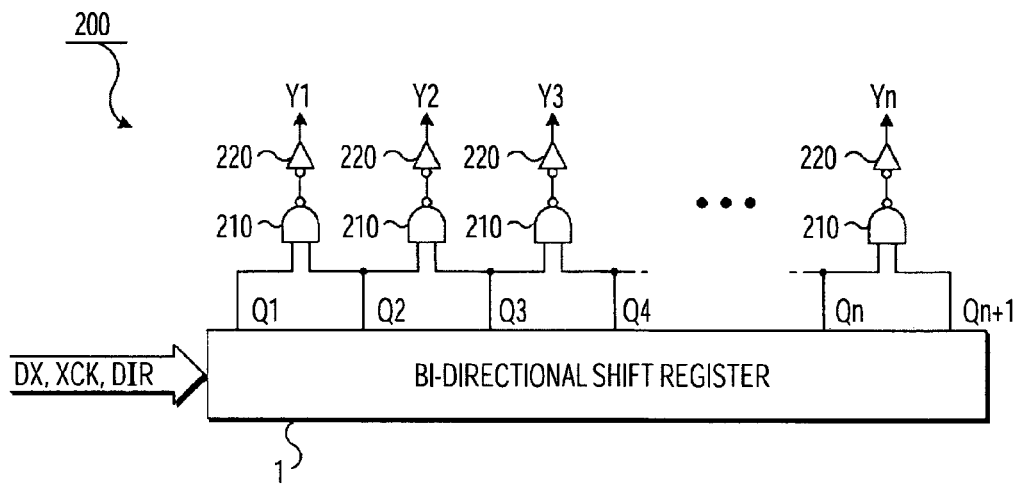
FIG. 20 is a circuit diagram of a data line driving circuit 200 used in the electro-optical device.

FIG. 20 is a block diagram illustrating a detailed structure of the data line driving circuit 200. As shown in FIG. 20, the data line driving circuit 200 has a bi-directional shift register 1, n NAND circuits 210, and n inverters 220. Here, the bi-directional shift register 1 has (n+1) stages. The NAND circuits 210 operate the inversion of the logical product of adjacent shift signals, and then the inverters 220 operates the inversion of the operation result to output the scanning signals Y1, Y2, ..., and Yn.

Figure 21:
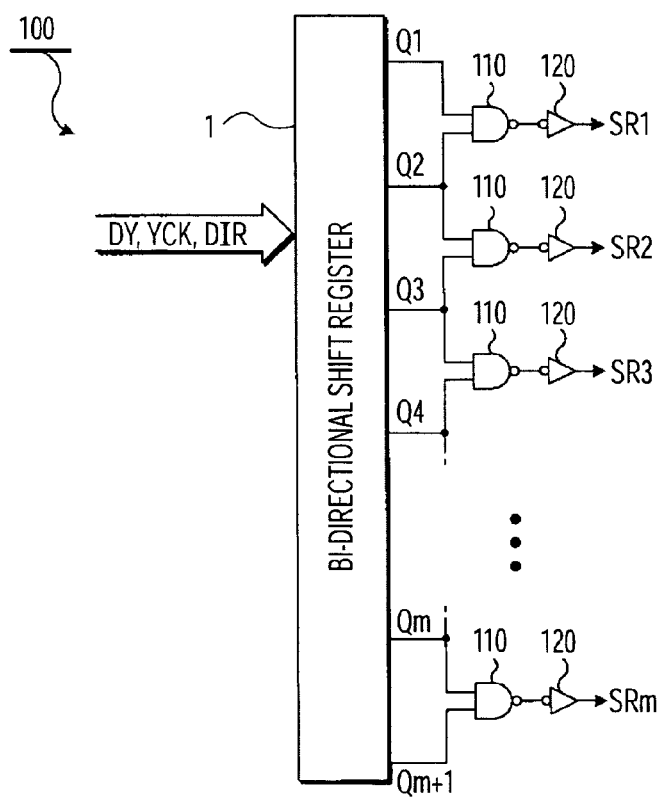
FIG. 21 is a circuit diagram of a scanning line driving circuit 100 used in the electro-optical device.

Next, FIG. 21 is a block diagram illustrating a detailed structure of the scanning line driving circuit 100. As shown in FIG. 21, the scanning line driving circuit 100 has a bi-directional shift register 1, m NAND circuits 110, and m inverters 120. Here, the bi-directional shift register 1 has (m+1) stages. The NAND circuits 110 operate the inversion of the logical product of adjacent shift signals, and then the inverters 120 operates the inversion of the operation result to output the sampling signals SR1, SR2, ..., and SRm.

Figure 22:
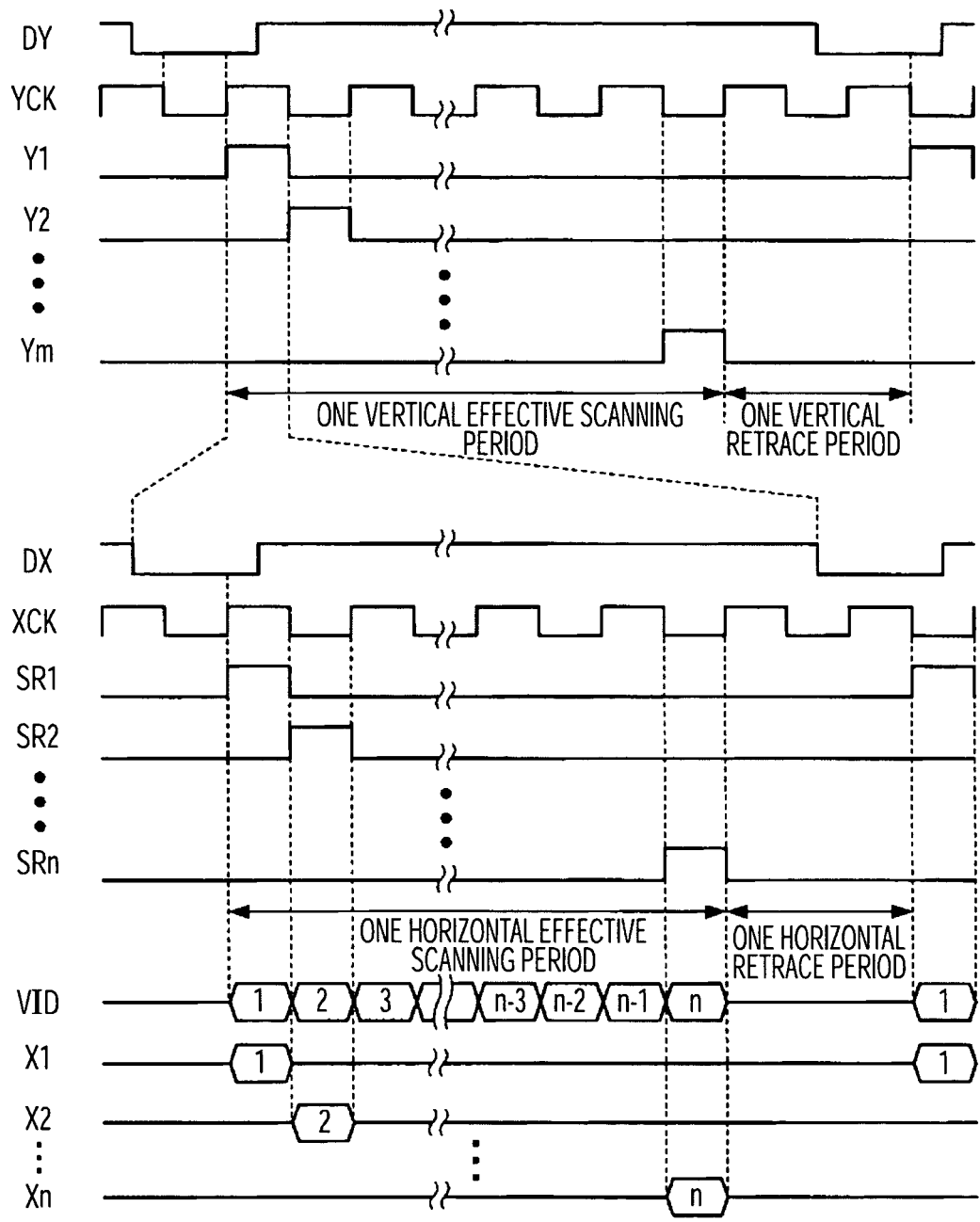
FIG. 22 is a timing chart illustrating the operation of the electro-optical device at the time of non-inverted image display.

Next, the display operation of the above-mentioned electro-optical device 500 will be described. First, the non-inverted image display operation will be described in a case in which a vertical scanning direction is a downward direction and a horizontal scanning direction is a rightward direction. In this case, since the transfer direction control signal DIR is an H level, the transfer gate TG1 shown in FIG. 1 is turned on, and the transfer gate TG2 is turned off. As a result, a Y transfer start pulse DY for defining a start point of the vertical scanning period is supplied to an upper end of a data transfer unit circuit of a first stage when counting the stages from the top. For this reason, as shown in FIG. 22, the scanning signals Y1, Y2, ..., and Ym are sequentially output.

Specifically, in FIG. 21, shift signals Q1, Q2, ..., and Qm+1 of first, second, third, ..., and m-th stages output from the bi-directional shift register 1 when counting the stages from the top becomes those obtained by receiving the Y transfer start pulses DY for a falling period of the Y clock signal YCK and then sequentially shifting them by a half cycle. Further, overlapping portions between shift signals output from adjacent stages are extracted by the NAND circuit 110 and the inverter 120 corresponding to the respective rows, and are then output as the scanning signals Y1, Y2, Y3, ..., and Ym.

Here, if the scanning signal Y1 enters an H level, all the TFTs 50 whose gates are connected to the scanning line 2 of the first row are turned on. For a period for which the scanning signal Y1 enters an H level, the image signal VID corresponding to each pixel is sequentially supplied through the image signal supply line L1 in synchronization with the supplied sampling signals SR1, SR2, ..., and SRn. In this case, if the sampling signal SR1 enters an H level, since the sampling switch SW1 of the first column is turned on, the image signal VID is sampled to the data line 3 of the first column. In addition, the image signal VID sampled to the data line 3 of the first column is applied to the pixel electrode 6 of the first row and the first column through the TFTs 50 having been turned on and is then written in the liquid crystal capacitor.

Next, if the sampling signal SR2 is an H level, since the sampling switch SW2 of the second column is turned on, the image signal VID is sampled to the data line 3 of the second column. In addition, the image signal VID sampled to the data line 3 of the second column is written in the liquid crystal capacitor of the first row and the second column through the TFT 50 having turned on. Hereinafter, in the same manner, the above-mentioned operation is repeated, so that the image signal VID is sampled and is then written in a liquid crystal capacitor of the first row and the n-th column. In this way, the writing of the signals is completed from the liquid crystal capacitor of the first row and the first column to the liquid crystal capacitor of the first row and the n-th column. Hereinafter, if the scanning signals Y2, Y3, ..., and Ym enter an H level sequentially, in each of the second, third, ..., and m-th rows, the writing with respect to the liquid crystal capacitor is performed from the first column to the n-th column in the same manner as the first row. In this way, a non-inverted image is formed in which the vertical scanning direction is a downward direction and the horizontal scanning direction is a right direction.

Figure 23:
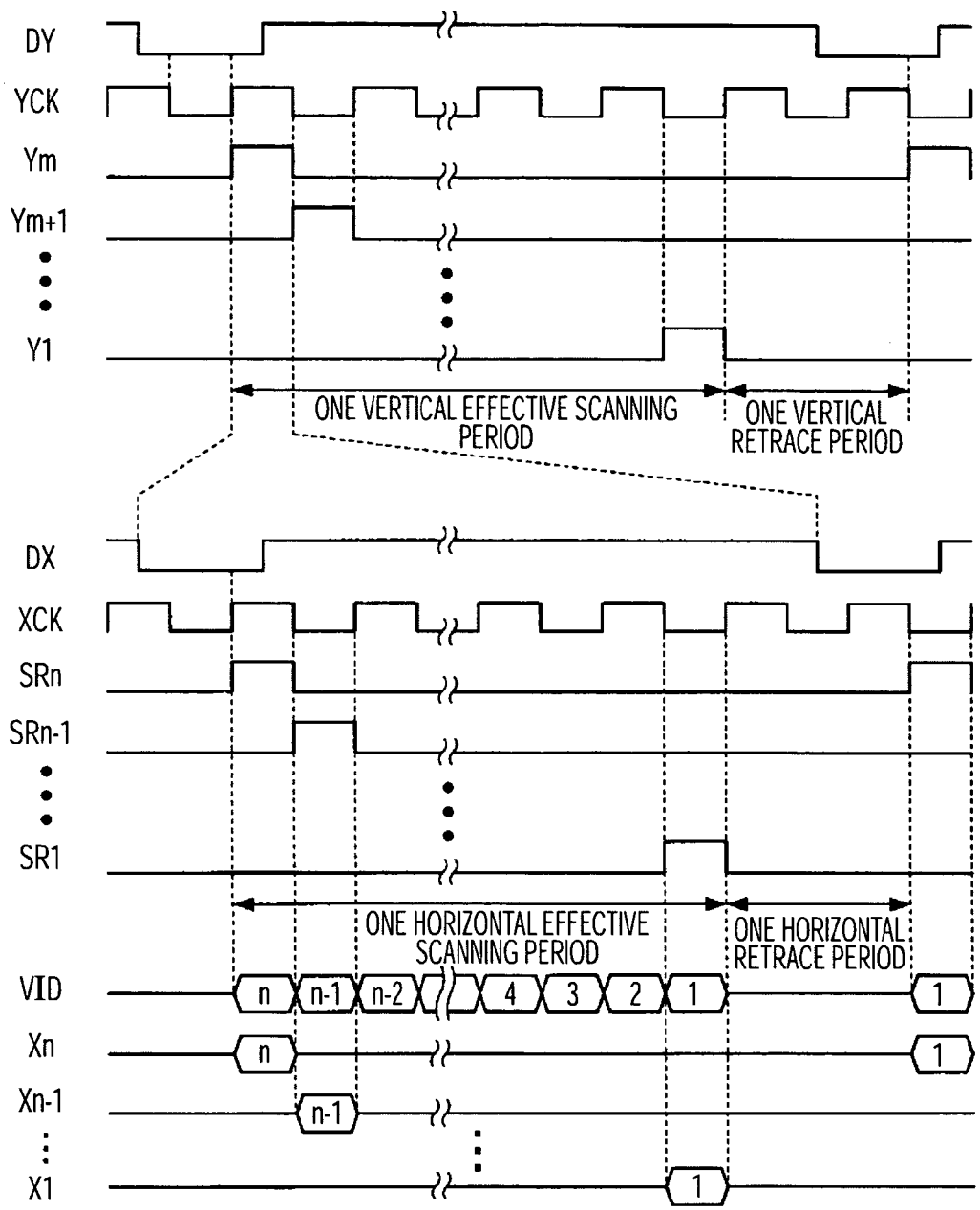
FIG. 23 is a timing chart illustrating the operation of the electro-optical device at the time of inverted image display.

Next, the inverted image display operation will be described in a case in which a vertical scanning direction is an upward direction and the horizontal scanning direction is a left direction. In this case, since the transfer direction control signal DIR is an L level, the transfer gate TG1 shown in FIG. 1 is turned off, and the transfer gate TG2 is turned on. As a result, a Y transfer start pulse DY is supplied to a lower end of a data transfer unit circuit of the (m+1)-th stage when counting the stages from the top. For this reason, as shown in FIG. 23, the scanning signals Ym, Ym−1, Ym−2, ..., and Y1 are sequentially output. Here, if the scanning signal Ym enters an H level, all the TFTs 50 whose gates are connected to the scanning line 2 of the m-th row are turned on. For a period for which the scanning signal Ym enters an H level, the image signal VID corresponding to each pixel is sequentially supplied through the image signal supply line L1 in synchronization with the supplied sampling signals SRn, SRn−1, ..., and SR1. In this case, if the sampling signal SRn enters an H level, since the sampling switch SWn of the n-th column is turned on, the image signal VID corresponding to the pixel of the m-th row and the n-th column is sampled to the data line 3 of the n-th column. In addition, the image signal VID sampled to the data line 3 of the n-th column is applied to the pixel electrode 6 of the m-th row and the n-th column through the TFTs 50 having been turned on and is then written in the liquid crystal capacitor.

Next, if the sampling signal SRn−1 is an H level, since the sampling switch SWn−1 of the (n−1)-th column is turned on, the image signal VID is sampled to the data line 3 of the (n−1)-th column. In addition, the image signal VID is written in the liquid crystal capacitor of the m-th row and the (n−1)-th column through the TFT 50s having been turned on. Hereinafter, in the same manner, the above-mentioned operation is repeated, so that the image signal VID is sampled and is then written in a liquid crystal capacitor of the m-th row and the first column. In this way, the writing of the signals is completed from the liquid crystal capacitor of the m-th row and the n-th column to the liquid crystal capacitor of the m-th row and the first column. Hereinafter, if the scanning signals Ym−1, Ym−2, ..., and Y1 enter an H level sequentially, in each of the (m−1)-th, (m−2)-th, ..., and first rows, the writing with respect to the liquid crystal capacitor is performed from the n-th column to the first column in the same manner as the m-th row. In this way, an inverted image of one frame is formed.

According to the above-mentioned electro-optical device 500, the non-inverted image display and the inverted image display can be achieved. In addition, the above-mentioned electro-optical device 500 is a liquid crystal display device using the liquid crystal as the electro-optical material, and the liquid crystal display device can be applied to any one of a transmissive type, a reflective type, and a transflective type. Further, the invention can be applied to not only an active-matrix type but also a passive-matrix type. Furthermore, the electro-optical device can be applied to various devices such as an organic EL device, a fluorescent display tube, a plasma display panel, a digital mirror device, or the like.

Electronic Apparatus

Next, examples of an electronic apparatus using the electro-optical device according to the above-mentioned embodiment will be described.

Figure 24:
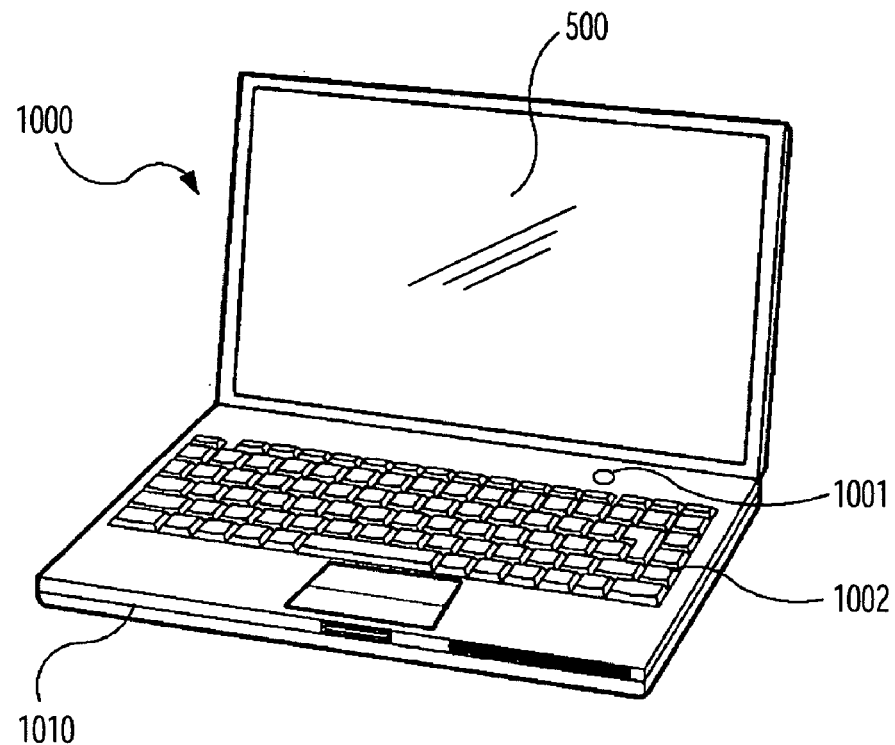
FIG. 24 is a perspective view illustrating a structure of a personal computer which is an example of an electronic apparatus to which the electro-optical device is applied.

FIG. 24 illustrates a structure of a mobile-type personal computer to which the electro-optical device 500 is applied. The personal computer 1000 includes an electro-optical device 500 serving as a display unit and a main body 1010. The main body 1010 has a power supply switch 1001 and a keyboard 1002. In this case, the liquid crystal panel AA of the electro-optical device 500 does not need to perform inverted image display. However, the electro-optical device 500 can also be used in other kinds of apparatuses that need to perform inverted image display. That is, the electro-optical device 500 in which non-inverted image display and inverted image display can be performed can improve versatility and reduce the cost of an apparatus in which the electro-optical device is installed.

Figure 25:
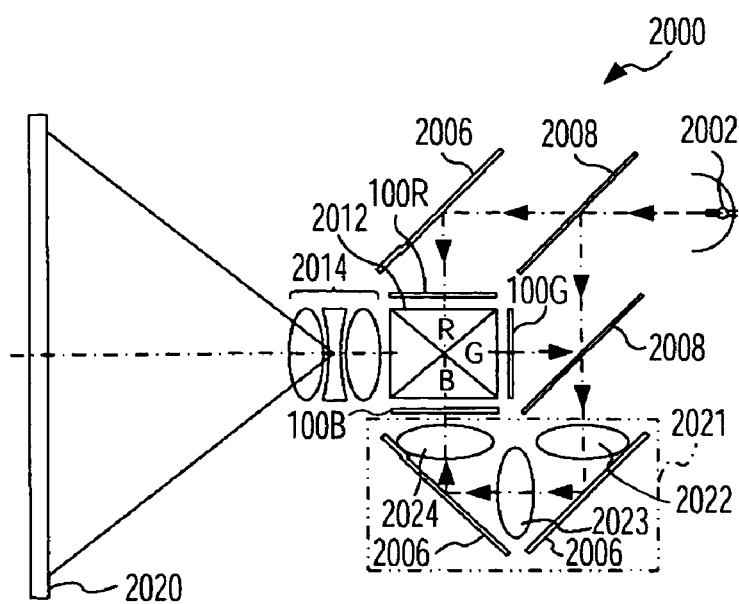
FIG. 25 is a block diagram illustrating a projector which is another example of the electronic apparatus to which the electro-optical device is applied.

FIG. 25 illustrates a structure of a projector using the electro-optical device 500. As shown in FIG. 25, a projector 2000 includes a lamp unit 2002 that is composed of a white light source such as a halogen lamp. Projection light emitted from the lamp unit 2002 is separated into three primary colors such as R (red), G (green), and B (blue) by three mirrors 2006 and two dichroic mirrors 2008 disposed in the lamp unit, and is then guided to light valves 100R, 100G, and 100B corresponding to the three primary colors. Here, each of the light valves 100R, 100G, and 100B is basically the same as the electro-optical device 500 according to the above-mentioned embodiment, that is, a transmissive liquid crystal display device. That is, the light valves 100R, 100G, and 100B function as an optical modulator that generates primary color images of RGB. In addition, if the B light is compared with the R light or the G light, since it has a longer optical path, the B light is guided through a relay system 2021 composed of an incident lens 2022, a relay lens 2023, and an emitting lens 2024 in order to prevent the loss of light. The light modulated by the light valves 100R, 100G, and 100B is incident ON a dichroic prism 2012 in three directions. In addition, in the dichroic prism 2012, the R light and the B light are refracted at 90 degrees, and the G light propagates straight. Thereby, a color image obtained by synthesizing the respective primary color images is projected ON a screen 2020 through a projection lens 2014. Here, when the projector 2000 commonly laid ON a desk is used in a state in which its bottom surface is pendant ON a ceiling surface, it is necessary that the left, right, top and bottom of a figure modulated by the light valves are reversed, compared with a case in which it is used ON the desk. In the present embodiment, if the vertical scanning direction through the scanning line driving circuit 100 is set to an upward direction and the horizontal scanning direction through the data line driving circuit 500 is set to the left direction, the reversed image is formed.

Figure 26:
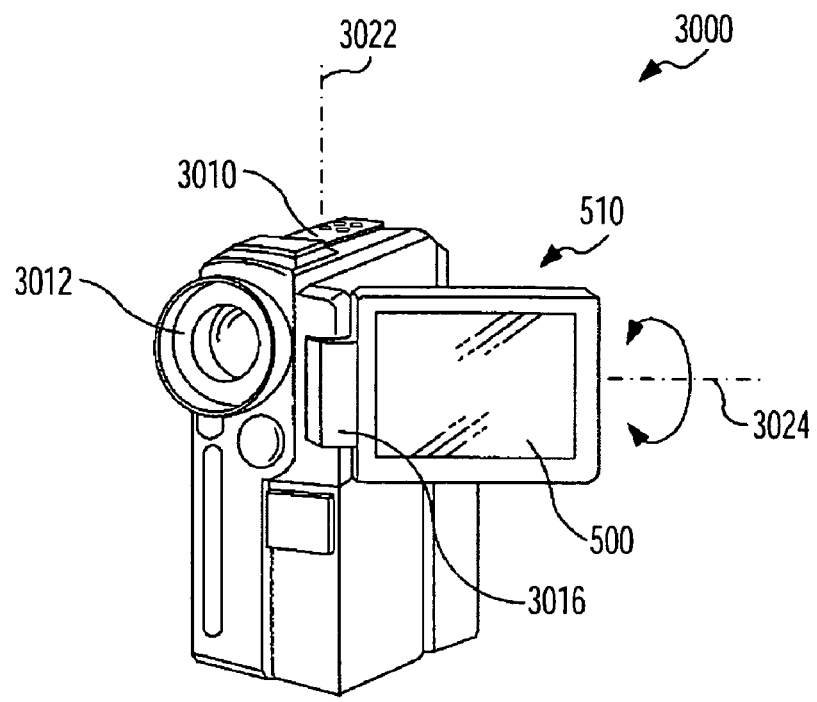
FIG. 26 is a block diagram illustrating a video camera which is still another example of the electronic apparatus to which the electro-optical device is applied.
Figure 27:
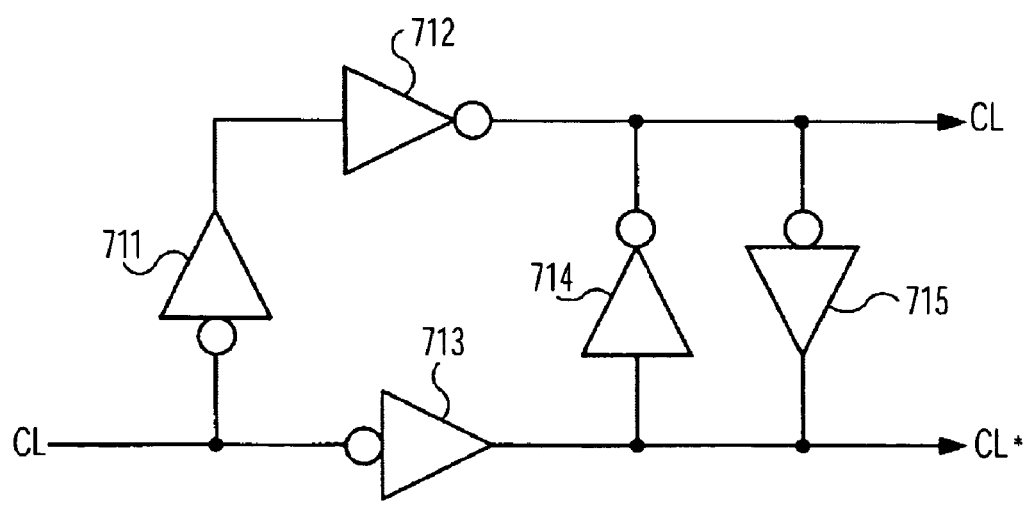
FIG. 27 is a circuit diagram of a waveform shaping circuit of a related art.

FIG. 26 illustrates a structure of a video camera using the electro-optical device 500. As shown in FIG. 26, a main body 3010 of a video camera 3000 has the electro-optical device 500 used as a monitor 510 and an optical system 3012. Here, the electro-optical device 500 is attached to a hinge 3016 so as to be rotatable about an axis 3024. Further, the hinge 3016 has a structure in which it is provided in the main body 3010 so as to be opened and closed about an axis 3022.

For this reason, the electro-optical device 500 needs to have a relationship that the left, right, top and bottom of a display image is reversed between the aspect illustrated in the drawing and an aspect used as a finder by a photographer located at a back side of the drawing. In the present embodiment, if the vertical scanning direction through the scanning line driving circuit 100 and the horizontal scanning direction through the data line driving circuit 200 are reversed, the left, right, top and bottom of the display image can be inverted. In addition, the electronic apparatus are not limited to the examples described with reference to FIGS. 24 to 26, but can be applied to all apparatuses which need to invert the left, right, top and bottom of the image in accordance with various situations.

What is claimed is:

1. A method of controlling a shift register in which a plurality of transfer unit circuits, each having a storage unit and a writing unit, are connected in series, the storage unit having a hold gate and storing a logical level of a pulse when the hold gate is in an active state, the writing unit having a writing gate and writing a pulse in the storage unit when the writing gate is in an active state, the method comprising:

performing control such that the writing gate is shifted from an active state to a non-active state and then the hold gate is shifted from a non-active state to an active state;

performing control such that the hold gate is shifted from the active state to the non-active state and then the writing gate is shifted from the non-active state to the active state; and shifting states of the writing gate and the hold gate in a transfer unit circuit of the current stage after detecting that the writing gate has entered a non-active state in a transfer unit circuit of the next stage provided in a transfer direction of the pulse.

2. The method of controlling a shift register according to claim 1, wherein the writing gate has a first transistor of a P-channel type and a second transistor of an N-channel type, and the hold gate has a third transistor of an N-channel type and a fourth transistor of a P-channel type, and the method further includes:

when the writing gate is shifted from the active state to the non-active state and the hold gate is shifted from the non-active state to the active state, performing control such that the first transistor is shifted from an ON state to an OFF state;

performing control such that the second transistor is shifted from an ON state to an OFF state;

performing control such that the third transistor is shifted from an OFF state to an ON state; and performing control such that the fourth transistor is shifted from an OFF state to an ON state; and when the writing gate is shifted from the non-active state to the active state and the hold gate is shifted from the active state to the non-active state, performing control such that the third transistor is shifted from the ON state to the OFF state;

performing control such that the fourth transistor is shifted from the ON state to the OFF state;

performing control such that the first transistor is shifted from the OFF state to the ON state; and performing control such that the second transistor is shifted from the OFF state to the ON state.

3. A shifter register comprising:

a transfer unit in which a plurality of transfer unit circuits, each having a storage unit and a writing unit, are connected in series, the storage unit having a hold gate and storing a logical level of a pulse when the hold gate is in an active state and the writing unit having a writing gate and writing a pulse in the storage unit when the writing gate is in an active state; and a control unit having a plurality of control unit circuits which are provided to correspond to the plurality of transfer unit circuits and control whether the hold gate and the writing gate are in an active state or a non-active state, wherein the control unit circuit performs control such that the hold gate is shifted from the non-active state to the active state after performing control such that the writing gate is shifted from the active state to the non-active state, wherein the control unit circuit performs control such that the writing gate is shifted from the non-active state to the active state after performing control such that the hold gate is shifted from the active state to the non-active state, and wherein a control unit circuit of any stage shifts states of the writing gate and the hold gate in a transfer unit circuit of the current stage after detecting that the writing gate had entered a non-active state in a transfer unit circuit of the next stage provided in a transfer direction of the pulse.

4. The shift register according to claim 3, wherein the writing gate has a first transistor of a P-channel type and a second transistor of an N-channel type and the hold gate has a third transistor of an N-channel type and a fourth transistor of a P-channel type, when the writing gate is shifted from the active state to the non-active state and the hold gate is shifted from the non-active state to the active state, the control unit circuit performs control such that the second transistor is shifted from an ON state to an OFF state after performing control such that the first transistor is shifted from an ON state to an OFF state, and performs control such that the fourth transistor is shifted from an OFF state to an ON state after performing control such that the third transistor is shifted from an OFF state to an ON state, and when the writing gate is shifted from the non-active state to the active state and the hold gate is shifted from the active state to the non-active state, the control unit circuit performs control such that the fourth transistor is shifted from the ON state to the OFF state after performing control such that the third transistor is shifted from the ON state to the OFF state, and performs control such that the second transistor is shifted from the OFF state to the ON state after performing control such that the first transistor is shifted from the OFF state to the ON state.

5. The shift register according to claim 4, wherein the control unit circuit has a clock input circuit that outputs a clock signal; and a clock supply circuit that supplies a first non-inverted control clock signal to the first transistor, supplies a first inverted control clock signal to the second transistor, supplies a second non-inverted control clock signal to the third transistor, and supplies a second inverted control clock signal to the fourth transistor, and the clock supply circuit has:

a NAND circuit that has one input terminal supplied with the clock signal and outputs the first non-inverted control clock signal;

a first inverting circuit that inverts the first non-inverted control clock signal and outputs the first inverted control clock signal;

a NOR circuit that has one input terminal supplied with the clock signal and the other input terminal supplied with the first inverted control clock signal and outputs the second non-inverted control clock signal; and a second inverting circuit that inverts the second non-inverted clock control signal to generate the second inverted control clock signal and supplies the generated second inverted control clock signal to the other input terminal of the NAND circuit.

6. The shift register according to claim 5, wherein a non-inverted input clock signal and an inverted input clock signal obtained by inverting the non-inverted input clock signal are alternately supplied to the clock input circuit provided in each of the plurality of control unit circuits as supply clock signals, and the clock input circuit has:

a first enable signal generating circuit that detects whether a first condition is satisfied and generates a first enable signal of negative logic to allow the supply clock signal to be input;

a second enable signal generating circuit that detects whether a second condition is satisfied and generates a second enable signal of positive logic to allow the supply clock signal to be input;

a NOR circuit to which the supply clock signal and the first enable signal are input;

a NAND circuit to which the supply clock signal and the second enable signal are input; and a selection circuit that selects any one of an output signal of the NOR circuit and an output signal of the NAND circuit on the basis of a transfer signal instructing a transfer direction of the pulse and outputs the selected output signal as the clock signal.

7. An electro-optical device comprising:

a plurality of scanning lines;

a plurality of data lines;

a plurality of electro-optical elements that are provided to correspond to intersections of the plurality of scanning lines and the plurality of data lines;

a scanning line driving circuit that drives the plurality of scanning lines; and a data line driving circuit that drives the plurality of data lines, wherein the scanning line driving circuit has the shift register according to claim 4, and generates a plurality of scanning signals such that the plurality of scanning signals enter an active state for a period for which shift signals output from adjacent transfer unit circuits simultaneously enter an active state and supplies the plurality of scanning signals to the plurality of corresponding scanning lines.

8. An electro-optical device comprising:
a plurality of scanning lines;
a plurality of data lines;
a plurality of electro-optical elements that are provided to correspond to intersections of the plurality of scanning lines and the plurality of data lines;
a scanning line driving circuit that drives the plurality of scanning lines; and
a data line driving circuit that drives the plurality of data lines,
wherein the data line driving circuit has the shift register according to claim 4, and generates a plurality of sampling signals such that the plurality of sampling signals enter an active state for a period for which shift signals output from adjacent transfer unit circuits simultaneously enter an active state and supplies a plurality of data signals obtained by sampling image signals in accordance with the plurality of sampling signals to the plurality of corresponding data lines.

9. An electronic apparatus comprising the electro-optical device according to claim 7.

* * * * *